(12) United States Patent
Okudo et al.

(10) Patent No.: US 8,067,769 B2
(45) Date of Patent: Nov. 29, 2011

(54) WAFER LEVEL PACKAGE STRUCTURE, AND SENSOR DEVICE OBTAINED FROM THE SAME PACKAGE STRUCTURE

(75) Inventors: Takafumi Okudo, Nara (JP); Yuji Suzuki, Hirakata (JP); Yoshiyuki Takegawa, Nara (JP); Toru Baba, Osaka (JP); Kouji Gotou, Neyagawa (JP); Hisakazu Miyajima, Osaka (JP); Kazushi Kataoka, Neyagawa (JP); Takashi Saijo, Kawanishi (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 561 days.

(21) Appl. No.: 12/094,674

(22) PCT Filed: Nov. 24, 2006

(86) PCT No.: PCT/JP2006/323453
§ 371 (c)(1),
(2), (4) Date: Jun. 12, 2008

(87) PCT Pub. No.: WO2007/061054
PCT Pub. Date: May 31, 2007

(65) Prior Publication Data
US 2009/0267165 A1 Oct. 29, 2009

(30) Foreign Application Priority Data

| Nov. 25, 2005 | (JP) | 2005-341223 |
| Nov. 25, 2005 | (JP) | 2005-341225 |
| Nov. 25, 2005 | (JP) | 2005-341253 |
| Dec. 22, 2005 | (JP) | 2005-371049 |
| Dec. 22, 2005 | (JP) | 2005-371053 |
| Mar. 28, 2006 | (JP) | 2006-089558 |
| Mar. 28, 2006 | (JP) | 2006-089589 |

(51) Int. Cl.
*H01L 21/66* (2006.01)

(52) U.S. Cl. ............ 257/48; 438/17; 257/417; 257/415; 257/419; 257/254

(58) Field of Classification Search .................. 73/493, 73/514.33; 310/328
See application file for complete search history.

(56) References Cited

U.S. PATENT DOCUMENTS
4,988,035 A 1/1991 Ueno et al.
(Continued)

FOREIGN PATENT DOCUMENTS
DE 103 51 761 A1 5/2004
(Continued)

OTHER PUBLICATIONS

Notice of Official Action for the Application No. 095143570 from Taiwan Intellectual Property Office dated Dec. 14, 2009.
(Continued)

*Primary Examiner* — Zandra Smith
*Assistant Examiner* — Tsz Chiu
(74) *Attorney, Agent, or Firm* — Cheng Law Group, PLLC

(57) ABSTRACT

A wafer level package structure with a plurality of compact sensors such as acceleration sensors and gyro sensors is provided. This package structure is composed of a semiconductor wafer with plural sensor units, and a pair of package wafers bonded to both surfaces of the semiconductor wafer. Each of the sensor units has a frame having an opening, a movable portion held in the opening to be movable relative to the frame, and a detecting portion for outputting an electric signal according to a positional displacement of the movable portion. Since the semiconductor wafer is bonded to each of the package wafers by a solid-phase direct bonding without diffusion between a surface-activated region formed on the frame and a surface-activated region formed on the package wafer, it is possible to prevent that variations in sensor characteristics occur due to residual stress at the bonding interface.

22 Claims, 24 Drawing Sheets

U.S. PATENT DOCUMENTS

| | | | |
|---|---|---|---|
| 5,392,650 A * | 2/1995 | O'Brien et al. | 73/514.18 |
| 5,448,014 A * | 9/1995 | Kong et al. | |
| 5,525,549 A * | 6/1996 | Fukada et al. | |
| 5,654,244 A * | 8/1997 | Sakai et al. | |
| 5,869,876 A * | 2/1999 | Ishio et al. | |
| 5,948,982 A * | 9/1999 | Woodruff et al. | 73/514.29 |
| 6,222,868 B1 | 4/2001 | Ouchi et al. | |
| 6,228,675 B1 | 5/2001 | Ruby et al. | |
| 6,257,060 B1 * | 7/2001 | Leonardson et al. | 73/514.29 |
| 6,465,892 B1 | 10/2002 | Suga | |
| 6,555,901 B1 | 4/2003 | Yoshihara et al. | |
| 6,596,117 B2 * | 7/2003 | Hays et al. | |
| 6,683,358 B1 * | 1/2004 | Ishida et al. | 257/417 |
| 6,701,786 B2 * | 3/2004 | Hulsing, II | 73/514.02 |
| 6,892,578 B2 * | 5/2005 | Saitoh et al. | 73/514.33 |
| 7,019,231 B2 * | 3/2006 | Ishikawa et al. | 200/61.45 R |
| 7,089,792 B2 * | 8/2006 | Geen | 73/504.14 |
| 7,243,542 B2 * | 7/2007 | Hulsing, II | 73/514.02 |
| 7,406,870 B2 * | 8/2008 | Seto | 73/514.33 |
| 7,617,728 B2 * | 11/2009 | Cardarelli | 73/504.16 |
| 7,674,638 B2 * | 3/2010 | Okudo et al. | 438/17 |
| 7,968,958 B2 * | 6/2011 | Fujii et al. | 257/415 |
| 2002/0008444 A1 * | 1/2002 | Sakata et al. | 310/328 |
| 2002/0180031 A1 | 12/2002 | Yamaguchi et al. | |
| 2003/0003684 A1 * | 1/2003 | Farrens et al. | |
| 2003/0038328 A1 * | 2/2003 | Ishio | |
| 2003/0183921 A1 * | 10/2003 | Komobuchi et al. | 257/704 |
| 2004/0016942 A1 * | 1/2004 | Miyazawa et al. | |
| 2004/0016981 A1 * | 1/2004 | Yoshida et al. | 257/414 |
| 2004/0053435 A1 | 3/2004 | Ikushima et al. | |
| 2004/0065638 A1 * | 4/2004 | Gogoi | |
| 2004/0207485 A1 | 10/2004 | Kawachi et al. | |
| 2004/0238943 A1 | 12/2004 | Fujii | |
| 2004/0245891 A1 * | 12/2004 | Kawachi et al. | |
| 2005/0167795 A1 * | 8/2005 | Higashi | 257/678 |
| 2005/0217373 A1 * | 10/2005 | Ishikawa et al. | 73/493 |
| 2006/0022325 A1 * | 2/2006 | Hwang et al. | 257/690 |
| 2007/0111471 A1 * | 5/2007 | Okada | |
| 2007/0158822 A1 | 7/2007 | Fujii | |
| 2008/0302185 A1 * | 12/2008 | Yakabe et al. | |
| 2009/0267165 A1 * | 10/2009 | Okudo et al. | |

FOREIGN PATENT DOCUMENTS

| | | | |
|---|---|---|---|
| EP | 0 278 030 A1 | 8/1988 | |
| EP | 0 905 838 A1 | 3/1999 | |
| JP | 60-053054 A | 3/1985 | |
| JP | 02-012663 U | 1/1990 | |
| JP | 02-063173 A | 3/1990 | |
| JP | 02-079044 U | 6/1990 | |
| JP | 2-218172 A * | 8/1990 | |
| JP | 3-67177 A * | 3/1991 | |
| JP | 05-095122 A | 4/1993 | |
| JP | 05-175247 A | 7/1993 | |
| JP | 5-281251 A * | 10/1993 | |
| JP | 05-288771 A | 11/1993 | |
| JP | 6-45618 A * | 2/1994 | |
| JP | 6-318625 A * | 11/1994 | |
| JP | 07-283334 A | 10/1995 | |
| JP | 08-015300 A | 1/1996 | |
| JP | 8-18068 A * | 1/1996 | |
| JP | 08-032090 A | 2/1996 | |
| JP | 9-203747 A * | 8/1997 | |
| JP | 09-266266 A | 10/1997 | |
| JP | 9-292049 A * | 11/1997 | |
| JP | 10-177034 A * | 6/1998 | |
| JP | 2791429 B2 | 8/1998 | |
| JP | 2001-060635 A | 3/2001 | |
| JP | 2001-068616 A | 3/2001 | |
| JP | 2001-183389 A * | 7/2001 | |
| JP | 2003-69044 A * | 3/2003 | |
| JP | 2003-100919 A | 4/2003 | |
| JP | 2003-179085 A | 6/2003 | |
| JP | 2003-318178 A * | 11/2003 | |
| JP | 2003-329704 A | 11/2003 | |
| JP | 2004-057507 A | 2/2004 | |
| JP | 2004-085547 A | 3/2004 | |
| JP | 2004-109114 A | 4/2004 | |
| JP | 3532788 B2 | 5/2004 | |
| JP | 2004-200547 A | 7/2004 | |
| JP | 2004-209585 A | 7/2004 | |
| JP | 2004-233072 A | 8/2004 | |
| JP | 2004-304622 A | 10/2004 | |
| JP | 2004-364041 A * | 12/2004 | |
| JP | 2005-091166 A | 4/2005 | |
| JP | 2005-127750 A | 5/2005 | |
| JP | 2005-129888 A | 5/2005 | |
| JP | 2005-166909 A | 6/2005 | |
| JP | 2005-181644 A * | 7/2005 | |
| JP | 2005-191556 A * | 7/2005 | |
| JP | 2005-251898 A | 9/2005 | |
| JP | 2005-292117 A | 10/2005 | |
| JP | 2006-202974 A * | 8/2006 | |
| KR | 1998-86900 A | 12/1998 | |
| KR | 2003-17428 A | 3/2003 | |
| TW | 093107297 | 2/2006 | |
| WO | WO-2005/086597 A2 | 9/2005 | |
| WO | WO-2005/104228 A1 | 11/2005 | |
| WO | WO-2006/030716 A1 * | 3/2006 | |

OTHER PUBLICATIONS

International Search Report for the Application No. PCT/JP2006/323453 mailed Feb. 6, 2007.
Decision of Refusal for the Application No. 2006-089558 from Japan Patent Office mailed Sep. 25, 2007.
Decision of Refusal for the Application No. 2006-089589 from Japan Patent Office mailed Sep. 25, 2007.
Decision of Refusal for the Application No. 2006-089633 from Japan Patent Office mailed Sep. 25, 2007.
Notification of Reasons for Refusal for the Application No. 2006-089634 from Japan Patent Office mailed Dec. 26, 2006.
Notification of Reasons for Refusal for the Application No. 2006-089558 from Japan Patent Office mailed Mar. 6, 2007.
Notification of Reasons for Refusal for the Application No. 2006-089633 from Japan Patent Office mailed Mar. 6, 2007.
Takagi, Hideki et al., "Low Temperature, Pressure Less Bonding of Si and SiO$_2$ by the Surface Activation Method", Japan Welding Society Paper, 1997, vol. 61, pp. 224-225.
Itoh, Toshihiro et al., "Problems in MEMS Packaging and Application of Surface Activated Bonding (SAB) Method", Electronics Mounting Society Paper, 2001, vol. 4, No. 1, pp. 25-27.
Esashi, Masayoshi, "MEMS and Its Application", Journal of Japan Institute of Electronics Packaging, 2002, vol. 5, No. 6, pp. 537-541.
Suga, Tadatomo, "Bonding Technology for Micro-Machines", Plastic Processing Symposium, 2002, 211th, pp. 15-20.
Akaike, Hirotake et al., "Technology Tendency of Bonding for MEMS Device by Japanese Patent Research", Japan Institute of Electronics Packaging, 2003, vol. 6, No. 7, pp. 602-609.
Korean Office Action for the Application No. 10-2008-7012313 from Korean Intellectual Property Office dated Nov. 30, 2010.
International Search Report for Application No. PCT/JP2006/323455 mailed Feb. 6, 2007.
International Search Report for Application No. PCT/JP2006/323459 mailed Feb. 6, 2007.
Taiwanese Office Action for the Application No. 095143554 from Taiwanese Patent Office dated Sep. 17, 2009.
U.S. Restriction Requirement for the U.S. Appl. No. 12/094,772 from U.S. Patent and Trademark Office mailed Jun. 8, 2010.
U.S. Restriction Requirement for the U.S. Appl. No. 12/094,600 from U.S. Patent and Trademark Office mailed Jan. 5, 2011.
U.S. Non-Final Office Action for the U.S. Appl. No. 12/094,772 from U.S. Patent and Trademark Office mailed Sep. 28, 2010.
U.S. Non-Final Office Action for the U.S. Appl. No. 12/094,600 from U.S. Patent and Trademark Office mailed Mar. 1, 2011.
Notification of Reasons for Refusal for Application No. 2006-089555 from Japan Patent Office mailed Dec. 5, 2006.
Notification of Reasons for Refusal for Application No. 2006-089556 from Japan Patent Office mailed Dec. 5, 2006.
Notification of Reasons for Refusal for Application No. 2006-089579 from Japan Patent Office mailed Dec. 5, 2006.

Notification of Reasons for Refusal for Application No. 2006-089580 from Japan Patent Office mailed Dec. 5, 2006.
Notification of Reasons for Refusal for Application No. 2005-371042 from Japan Patent Office mailed Dec. 26, 2006.
Notification of Reasons for Refusal for Application No. 2006-089586 from Japan Patent Office mailed Dec. 26, 2006.
Notification of Reasons for Refusal for Application No. 2006-089588 from Japan Patent Office mailed Mar. 6, 2007.
Supplementary European Search Report for the Application No. 06 83 3259 dated Jun. 24, 2011.

* cited by examiner

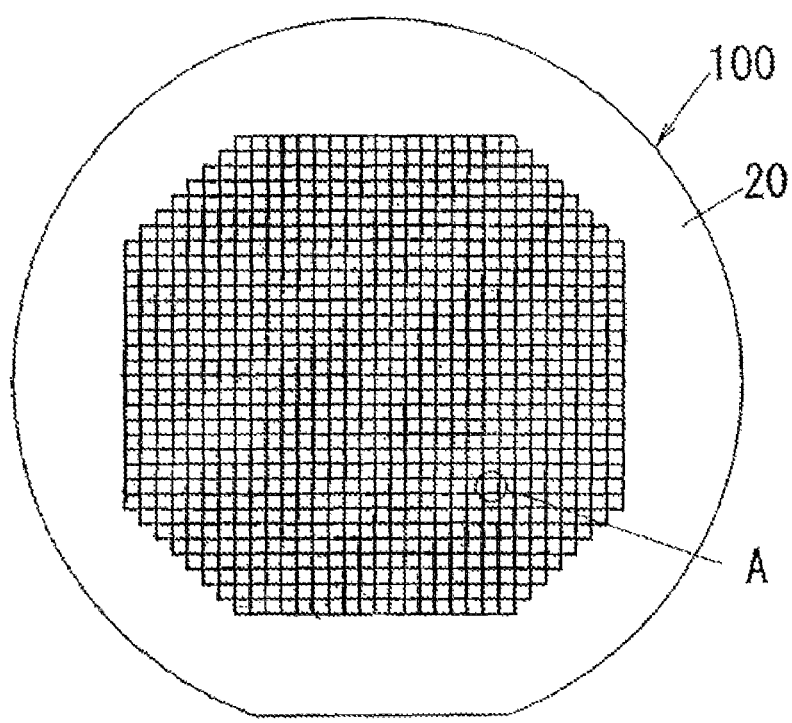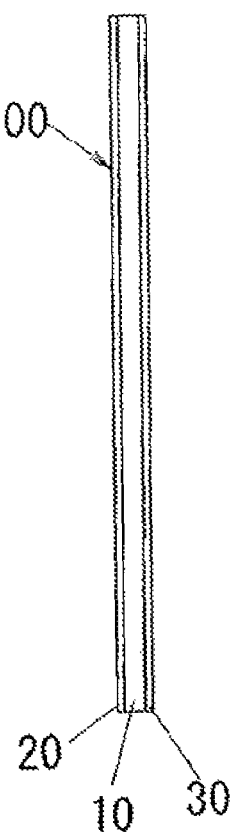
FIG.1A
FIG.1B

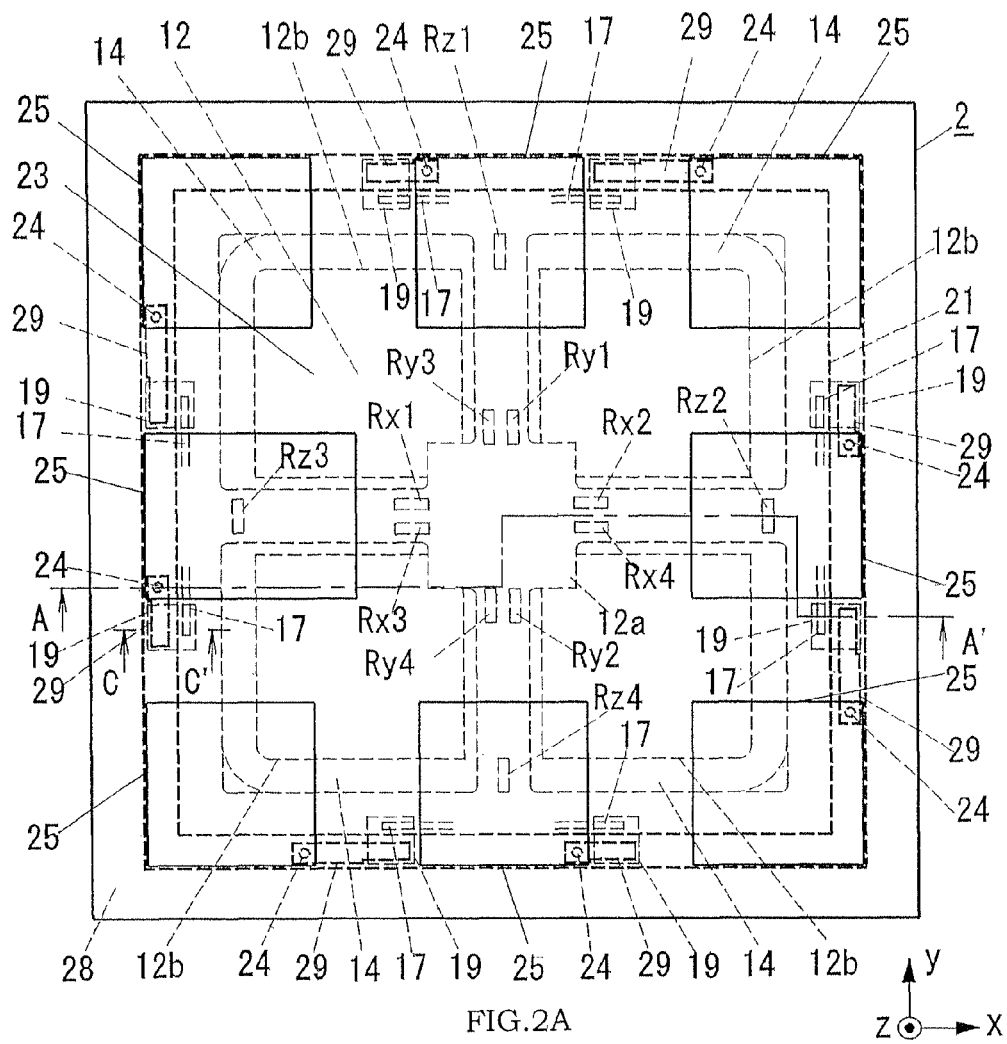
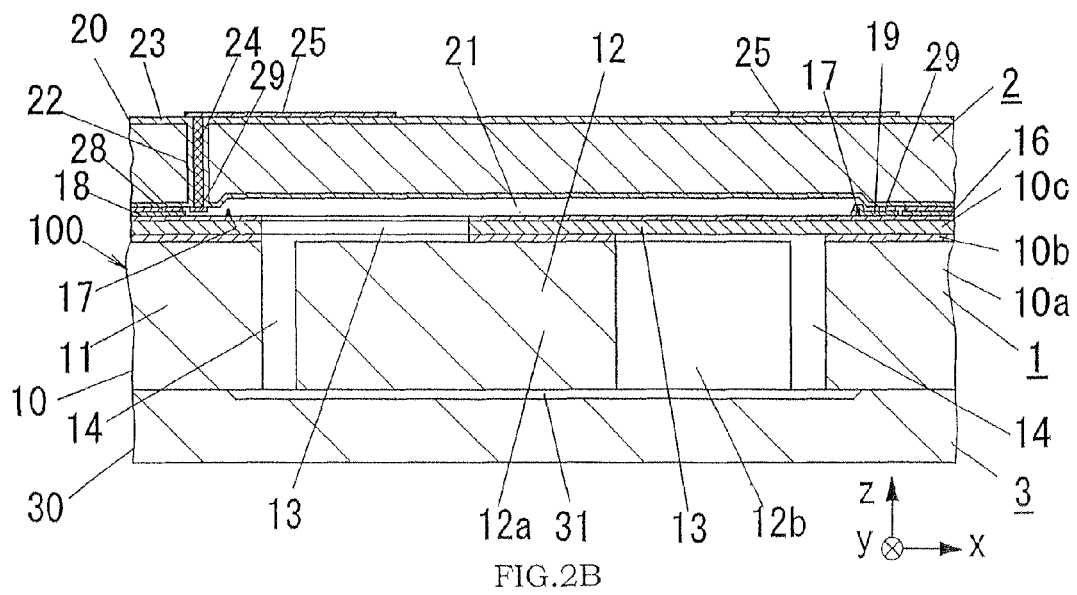
FIG.2A
FIG.2B

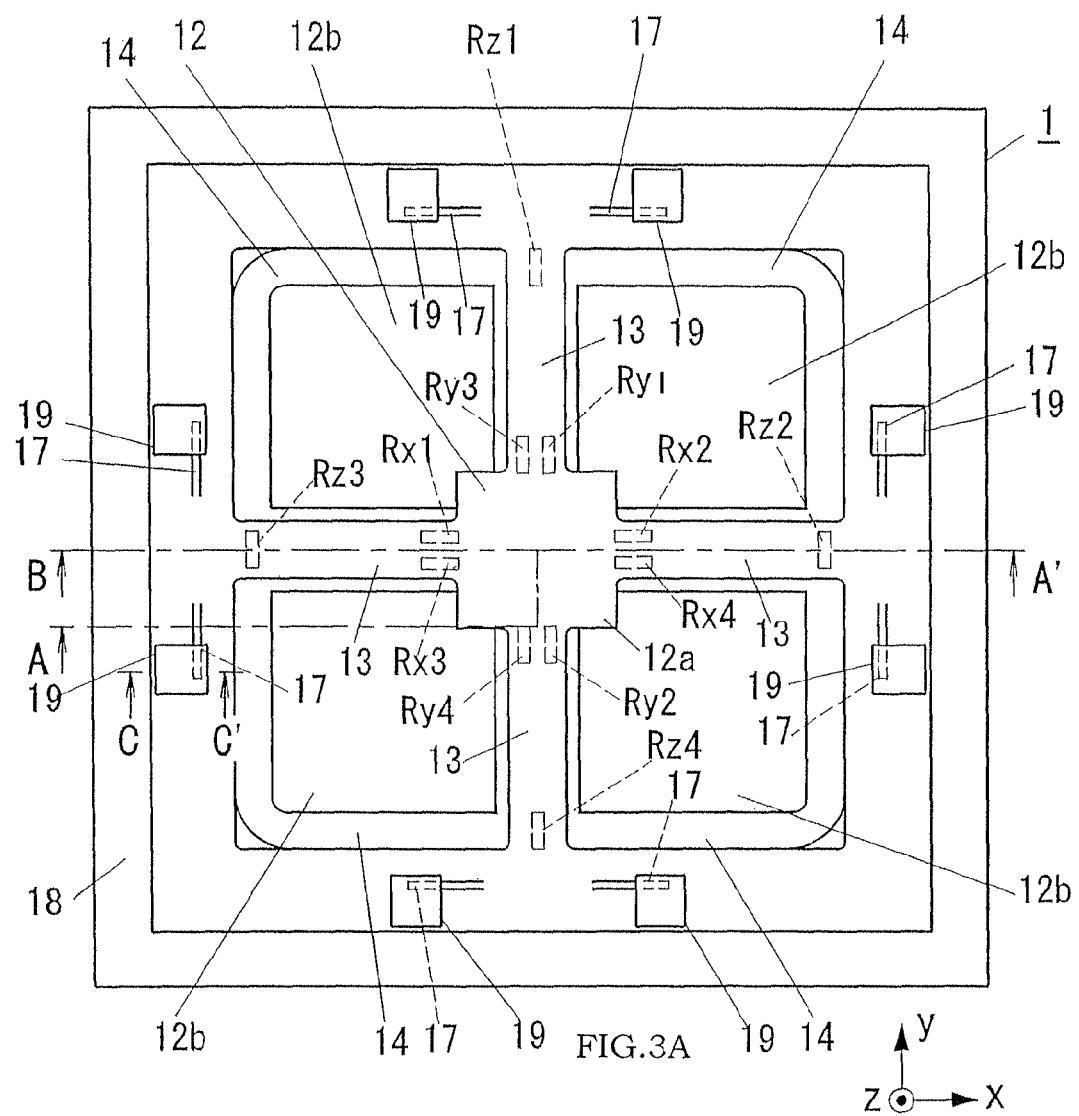
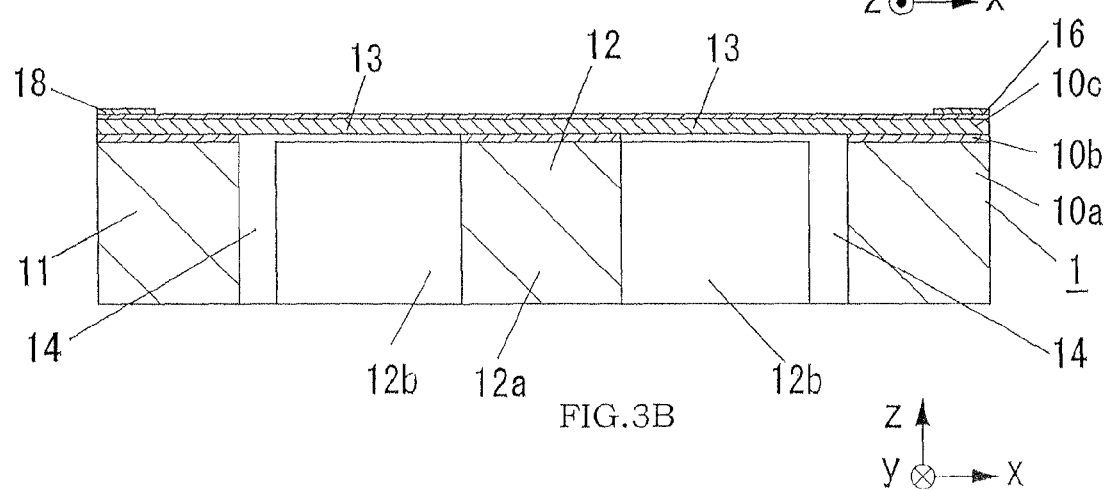

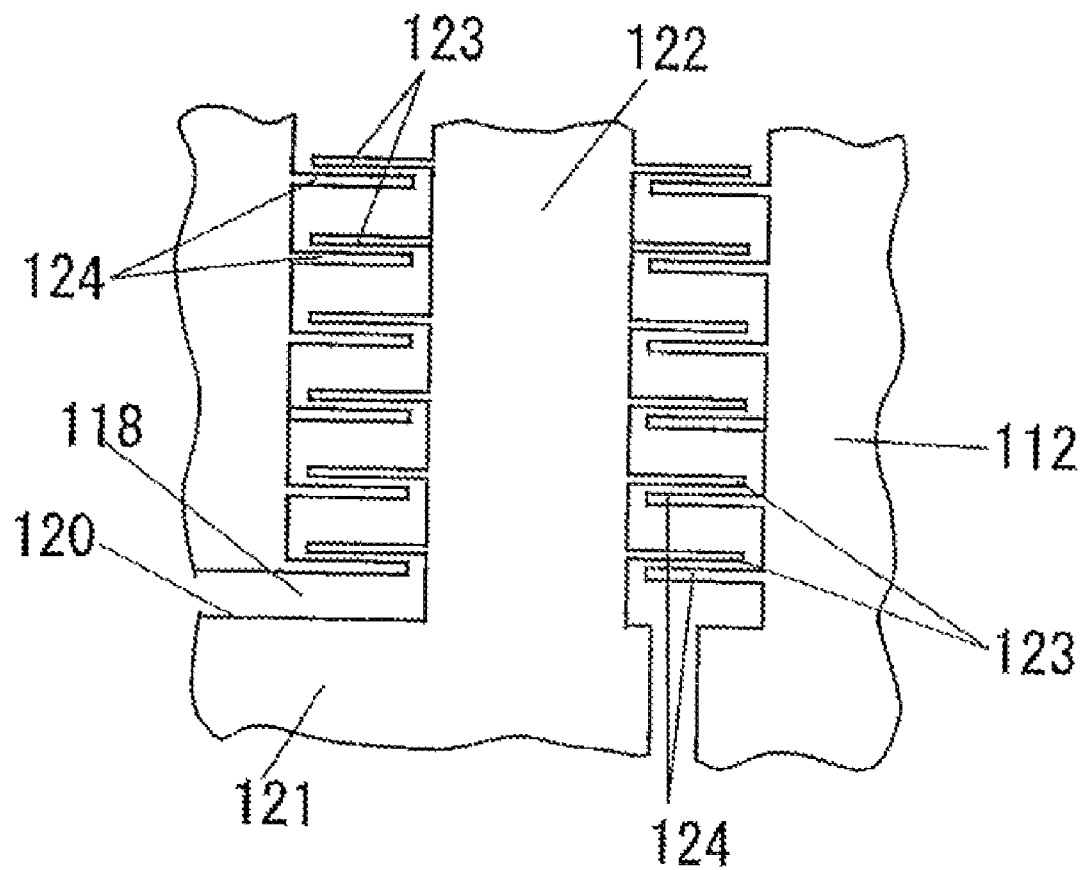
FIG.21
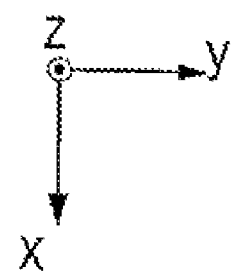

Prior Art

US 8,067,769 B2

WAFER LEVEL PACKAGE STRUCTURE, AND SENSOR DEVICE OBTAINED FROM THE SAME PACKAGE STRUCTURE

TECHNICAL FIELD

The present invention relates to a wafer level packaging technique for manufacturing compact sensor devices such as an acceleration sensor and a gyro sensor.

BACKGROUND ART

In recent years, wafer level packaging technique has attracted lots of attention as an appropriate manufacturing technique for sensor devices with chip size package (CSP).

For example, Japanese Patent Early Publication No. 2005-251898 discloses a manufacturing technique for a wafer level package structure 200, as shown in FIGS. 24A and 24B. That is, a sensor wafer 210 and a package wafer 220 are arranged in a face-to-face relation to each other, as shown in FIG. 24A. The sensor wafer 210 has a MEMS (Micro Electro Mechanical System) element 211 and a metal wiring (outgoing electrode) 217 electrically connected to a sensing portion (not shown) of the MEMS element 211. The package wafer 220 has a through-hole wiring 224 electrically connected with the metal wiring 217 and a concave portion 221 providing a space for airtightly sealing the MEMS element 211. Then, by forming a wafer level bonding between the sensor wafer 210 and the package wafer 220, as shown in FIG. 24B, the wafer level package structure 200 is obtained. Finally, plural sensor devices are separated from the wafer level package structure 200.

On a surface facing the package wafer 220 of the sensor wafer 210, a metal layer 218 is formed to surround the MEMS element 211 of the sensor body and the metal wiring 217 electrically connected to the MEMS element 211. On the other hand, a metal layer 228 surrounding the concave portion 221 is formed on a surface facing the sensor wafer 210 of the package wafer 220. In addition, a wiring layer 219 electrically connected to the metal wiring 217 is formed at an inner side of the metal layer 218 on the sensor wafer 210, and a wiring layer 229 electrically connected to the through-hole wiring 224 is formed at an inner side of the metal layer 228 on the package wafer 220. In the above-described wafer level package structure 200, the metal layer 218 of the sensor wafer 210 is bonded to the metal layer 228 of the package wafer 220 through a soldering portion 238 such as AuSn, and the wiring layer 219 of the sensor wafer 210 is bonded to the wiring layer 229 of the package wafer 220 through a soldering portion 239.

As the MEMS element 211, acceleration sensors and gyro sensors are well known. As the acceleration sensors, there are piezoresistance-type and capacitance-type acceleration sensors. The piezoresistance-type acceleration sensor is capable of detecting acceleration according to a change in resistance value resulting from a strain of a piezoresistive element as a gauge resistance caused when the acceleration is applied. The capacitance type acceleration sensor is capable of detecting acceleration according to a change in electric capacitance between stationary and movable electrodes when the acceleration is applied. In the piezoresistance-type acceleration sensor, there are cantilever type and double-supported beam type acceleration sensors. The cantilever type acceleration sensor is formed with a rectangular frame portion, a weight portion disposed inside of the frame portion, and a flexible beam portion connected at its one end to the weight portion such that the weight portion is movable relative to the frame portion. On the other hand, the double-supported beam type acceleration sensor is formed with a frame portion, a weight portion disposed inside of the frame portion, and a pair of flexible beam portions extending in opposite directions from the weight portion and configured to support the weight portion to be movable relative to the frame portion. In recent years, acceleration sensors for detecting acceleration with respect to each of three directions orthogonal to each other have been also proposed in, for example, Japanese Patent Early Publication No. 2004-109114 and No. 2004-233072. The acceleration sensors has a frame portion, a weight portion disposed inside of the frame portion, and four flexible beam portions extending in four directions and configured to support the weight portion so as to be movable relative to the frame portion.

In the above-described wafer level package structure 200, however, a prescribed amount of solder is supplied to the metal layer 228 and the wiring layer 229 by a solder shooting method to bond between the metal layers (218, 228) and between the wiring layers (219, 229). Then, a reflow soldering process is performed to a layered structure of the sensor wafer 210 and the package wafer 220. Therefore, when using the piezoresistance-type acceleration sensor body as the MEMS element 211, there is a problem that variations in sensor characteristics increase because residual stress at the vicinity of the bonding interface has an influence on the flexible beam portion(s). It is estimated that such an influence of the residual stress increases as the sensor device is downsized.

SUMMARY OF THE INVENTION

Therefore, in consideration of the above problems, a primary concern of the present invention is to provide a wafer level package structure capable of providing compact sensor devices having small variations in sensor characteristics, which is formed by bonding a semiconductor wafer with a plurality of compact sensor elements such as acceleration sensors and gyro sensors to a package wafer without almost causing residual stress at the bonding interface.

That is, the wafer level package structure of the present invention comprises:

a semiconductor wafer having a plurality of sensor units, each of which comprises a frame having an opening, a movable portion held in the opening to be movable relative to the frame, and a detecting portion configured to output an electric signal according to a positional displacement of the movable portion; a first package wafer bonded to one of opposite surfaces of the semiconductor wafer; and a second package wafer bonded to the other surface of the semiconductor wafer;

wherein the frame of each of the sensor units has a first surface-activated region formed on a surface facing the first package wafer over an entire circumference thereof so as to surround the movable portion, and a second surface-activated region formed on a surface facing the second package wafer over an entire circumference thereof so as to surround the movable portion, the bonding between the semiconductor wafer and the first package wafer is a solid-phase direct bonding without diffusion between the first surface-activated region and a surface-activated region formed on the first package wafer, and the bonding between the semiconductor wafer and the second package wafer is a solid-phase direct bonding without diffusion between the second surface-activated region and a surface-activated region formed on the second package wafer.

According to the present invention, since one surface of the semiconductor wafer is bonded over the entire circumference of the frame of each of the sensor units with the first package wafer, and the other surface of the semiconductor wafer is bonded over the entire circumference of the frame of each of the sensor units with the second package wafer, it is possible to seal an interior of each of the sensor units from the outside in an airtight manner. As a result, a desired atmosphere can be maintained in the interior of the sensor unit. For example, when the sensor unit is an acceleration sensor unit, an inert-gas atmosphere can be maintained in the interior of the sensor unit. Alternatively, when the sensor unit is a gyro sensor unit, a reduced atmosphere of high degree of vacuum can be maintained in the interior of the sensor unit. In addition, since each of the first and second package wafers is bonded to the semiconductor wafer by the solid-phase direct bonding without diffusion, it is possible to avoid a problem that variations in sensor characteristics occur due to residual stress at the bonding interface in the case of using a heat treatment such as reflow soldering as the bonding method. As a result, compact sensor devices each having small variations in sensor characteristics and good airtightness therein can be integrally formed in the wafer level package structure.

To obtain the solid-phase direct bonding with improved bonding strength, it is preferred that the first surface-activated region, the second surface-activated region, the surface-activated region of the first package wafer, and the surface-activated region of the second package wafer are any one of a plasma-treated surface, an ion-beam irradiated surface, and an atomic-beam irradiated surface. It is also preferred that at least one of the bonding between the first surface-activated region and the surface-activated region of the first package wafer and the bonding between the second surface-activated region and the surface-activated region of the second package wafer is any one of the solid-phase direct bonding between Au and Au, the solid-phase direct bonding between Cu and Cu, and the solid-phase direct bonding between Al and Al. Alternatively, at least one of the bonding between the first surface-activated region and the surface-activated region of the first package wafer and the bonding between the second surface-activated region and the surface-activated region of the second package wafer is preferably any one of the solid-phase direct bonding between Si and Si, the solid-phase direct bonding between Si and $SiO_2$, and the solid-phase direct bonding between $SiO_2$ and $SiO_2$.

To achieve an improvement in airtightness of the interior of the sensor unit, and increase the bonding reliability, it is preferred that at least one of the first surface-activated region and the second surface-activated region is composed of a ring-like outer surface-activated region formed over the entire circumference of the frame so as to surround the movable portion, and a ring-like inner surface-activated region formed at an inner side of the outer surface-activated region over the entire circumference of the frame so as to surround the movable portion. In this case, it is particularly preferred that an auxiliary sealing portion for connecting between the outer surface-activated region and the inner surface-activated region is formed at plural locations spaced from each other by a predetermined distance in the circumferential direction of the frame.

In addition, it is preferred that each of the sensor units has a conductive layer formed at a position closer to the movable portion than the first surface-activated region, and electrically connected to the detecting portion, the first package wafer has a through-hole wiring and a wiring layer electrically connected to the through-hole wiring with respect to each of the sensor units, and the bonding between the first package wafer and the semiconductor wafer further comprises a solid-phase direct bonding without diffusion between an activated surface of the conductive layer and an activated surface of the wiring layer. In this case, it is possible to simultaneously obtain the airtight sealing of the interior of the sensor unit and the electrical connection between the first package wafer and the semiconductor wafer. If necessary, the same solid-phase direct bonding for simultaneously forming the airtight sealing and the electrical connection may be formed in the case of bonding the second package wafer to the semiconductor wafer.

A further concern of the present invention is to provide a sensor device obtained by cutting the wafer level package structure described above into a size of the sensor unit. The thus obtained sensor device has a specific structure different from conventional sensor devices, which is characterized in that residual stress hardly occurs at the bonding interface, and the interior of the sensor device is airtightly sealed by the solid-phase direct bonding without diffusion.

BRIEF EXPLANATION OF THE DRAWINGS

FIGS. 1A and 1B are respectively schematic plan and side views of a wafer level package structure according to a first embodiment;

FIGS. 2A and 2B are respectively schematic plan and cross-sectional views of a sensor device obtained from the wafer level package structure;

FIG. 3A is a top view of a sensor substrate, and FIG. 3B is a cross-sectional view taken along the line B-A' in FIG. 3A;

FIG. 21 is an enlarged view of a relevant portion of the sensor substrate;

BEST MODE FOR CARRYING OUT THE INVENTION

Figure 4:
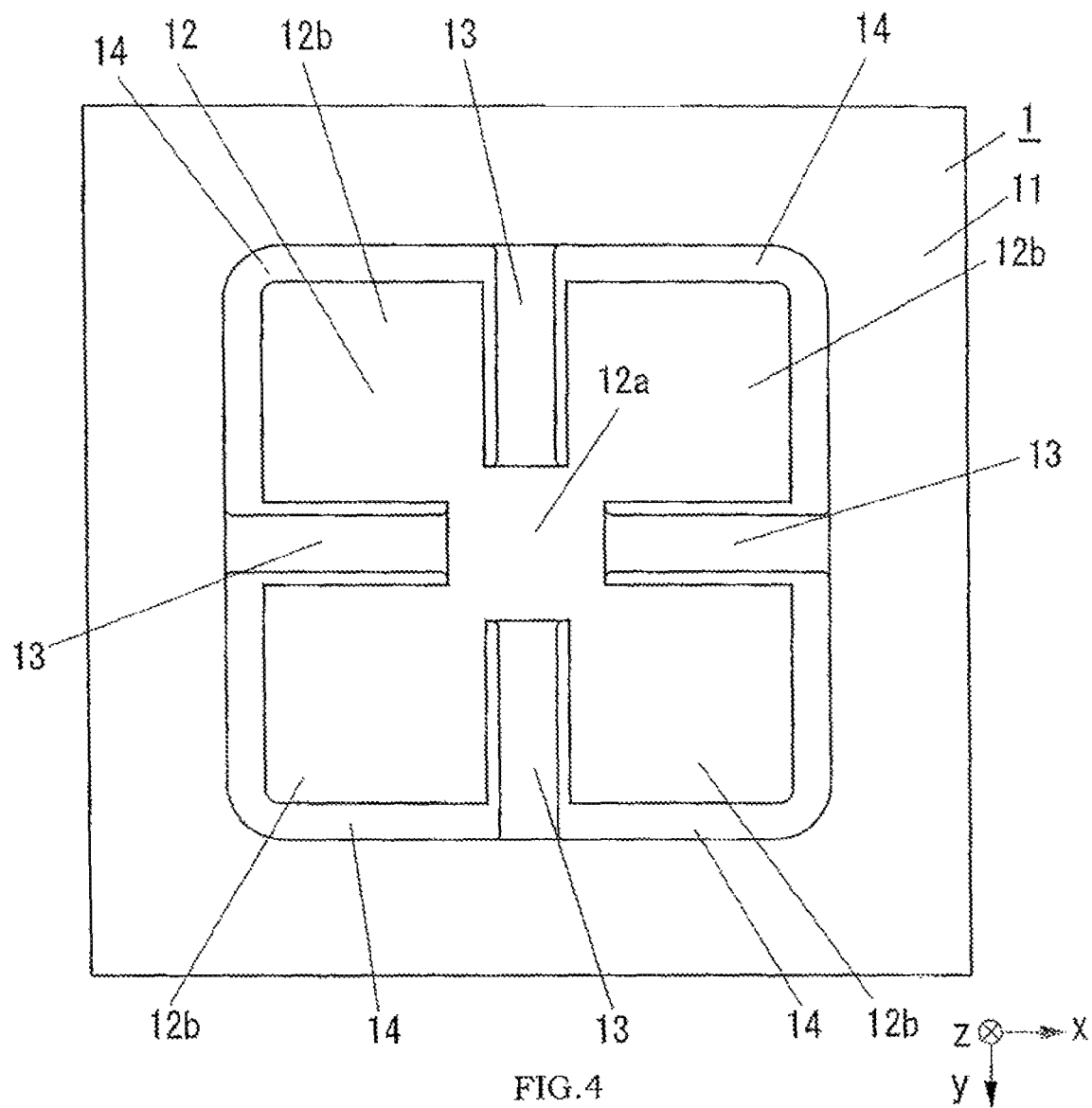
FIG. 4 is a bottom view of the sensor substrate.

Referring to the attached drawings, the wafer level package structure of the present invention and the sensor device obtained form the same structure are explained below in details.

First Embodiment

As shown in FIGS. 1A, 1B, and FIGS. 2A, 2B, a wafer level package structure 100 of the present embodiment has a structure comprised of a semiconductor wafer 10 with a plurality of acceleration sensor units, a first package wafer 20 bonded to one of opposite surfaces of the semiconductor wafer 10, and a second package wafer 30 bonded to the other surface of the semiconductor wafer 10. In the following explanation, a region for forming each of the acceleration sensor units of the semiconductor wafer 10 is defined as a sensor substrate 1. A region facing each of the sensor substrates 1 of the first package wafer 20 is defined as a first package substrate 2. A region facing each of the sensor substrates 1 of the second package wafer 30 is defined as a second package substrate 3.

In the present embodiment, an SOI wafer used as the semiconductor wafer 10 is composed of a support substrate 10a made of a silicon substrate, an insulating layer (embedded oxide film) 10b such as a silicon oxide film formed on the support substrate 10a, and an n-type silicon layer (active layer) 10c formed on the insulating layer 10b. Each of the acceleration sensor units is formed by processing this SOI wafer. Each of the first package wafer 20 and the second package wafer 30 is formed by processing a silicon wafer. In the present embodiment, a thickness of the support substrate 10a of the SOI substrate is in a range of 300 μm to 500 μm, a thickness of the insulating layer 10b is in a range of 0.3 μm to 1.5 μm, and a thickness of the silicon layer 10c is in a range of 4 μm to 10 μm. In addition, a surface of the silicon layer 10c that is a general surface of the SOI wafer corresponds to a (100) surface. A thickness of the silicon wafer for the first package wafer 20 is in a range of 200 μm to 300 μm, and a thickness of the silicon wafer for the second package wafer 30 is in a range of 100 μm to 300 μm. These thickness values are illustrative only, and therefore the present invention is not limited to them.

FIGS. 3A and 3B are respectively top and cross-sectional views of one acceleration sensor unit (corresponding to an area "A" in FIG. 1A) formed in the sensor substrate 1. In addition, FIG. 4 is a bottom view of the acceleration sensor unit. Each of the acceleration sensor units has a frame portion 11 (for example, a rectangular frame portion) having an inner opening, a weight portion 12 disposed inside of the frame portion 11, and four flexible portions 13 each formed in a strip-like shape and having flexibility. The weight portion 12 is supported at the top-surface side (FIG. 3A) of the sensor unit by the flexible portions 13 to be movable relative to the frame portion 11 in a swinging manner. In other words, the weight portion 12 is movably supported in the inner opening of the frame portion 11 in a swinging manner by the four flexible portions 13 extending from four sides of the weight portions toward the frame portion 11. The frame portion 11 is formed by use of the support substrate 10a, the insulating layer 10b and the silicon layer 10c of the above-described SOI substrate. On the other hand, as shown in FIG. 3B, the flexible portions 13 are formed by use of the silicon layer 10c of the SOI substrate. Therefore, the flexible portion 13 has a sufficiently smaller thickness than the frame portion 11.

The weight portion 12 has a core section 12a having a rectangular solid shape, which is supported to the frame portion 11 through the four flexible portions 13, and four weights 12b each having a rectangular solid shape, which are integrally coupled to four corners of the core section 12a at the top-surface side of the sensor substrate 1. That is, when viewing from the above of the sensor substrate 1, each of the weights 12b is disposed in a spaced surrounded by the frame portion 11, the core section 12a, and two flexible portions 13 extending in directions orthogonal to each other. The numeral 14 designates a slit formed between each of the weights 12b and the frame portion 13. A distance between adjacent weights 12b through the flexible portion 13 is set to be larger than the width dimension of the flexible portion 13. The core section 12a is formed by use of the support substrate 10a, the insulating layer 10b and the silicon layer 10c of the above-described SOI wafer. On the other hand, each of the weights 12b is formed by use of the support substrate 10a of the SOI wafer. At the top-surface side of the sensor substrate 1, the top surface of each of the weights 12b is provided at a lower position than the top sure of the core section 12a, i.e., at a side closer to the bottom of the sensor substrate 1 (FIG. 4). The frame portion 11, the weight portion 12 and the flexible portions 13 of the sensor substrate 1 are preferably formed by using conventional lithography and etching technologies.

By the way, as shown at a lower right portion of each of FIGS. 3A, 3B and 4, when a horizontal direction of the frame portion 11 corresponds to an "x" axis, a horizontal direction orthogonal to the "x" axis corresponds to a "y" axis, and a thickness direction of the sensor substrate 1 corresponds to a "z" axis, the weight portion 12 is supported to the frame portion 11 by a pair of the flexible portions 13 extending in the "x" axis direction at both sides of the core section 12a, and another pair of the flexible portions 13 extending in the "y" axis direction at both sides of the core section 12a. The rectangular coordinate system defining the above-described "x", "y" and "z" axes has an origin, which corresponds to a center position of the top surface of the weight portion 12 formed by the silicon layer 10c of the sensor substrate 1.

On the flexible portion 13 extending from the core section 12a of the weight portion 12 in a positive direction of the "x" axis, i.e., the flexible portion 13 positioned at the right side of FIG. 3A, a pair of piezoresistive elements (Rx2, Rx4) are formed near the core section 12a, and a piezoresistive element Rz2 is formed near the frame portion 11. On the other hand, on the flexible portion 13 extending from the core section 12a of the weight portion 12 in a negative direction of the "x" axis, i.e., the flexible portion 13 positioned at the left side of FIG. 3A, a pair of piezoresistive elements (Rx1, Rx3) are formed near the core section 12a, and a piezoresistive element Rz3 is formed near the frame portion 11. In this regard, the four piezoresistive elements (Rx1, Rx2, Rx3, Rx4) formed near the core section 12a is used to detect acceleration in the "x" axis direction. Each of the piezoresistive elements (Rx1, Rx2, Rx3, Rx4) is formed in an elongate rectangular shape as a planar shape, and disposed such that the elongate direction of the piezoresistive element is substantially the same as the longitudinal direction of the flexible portion 13. In addition, these piezoresistive elements are connected by wirings (diffusion layer wirings and metal wirings 17 formed on the sensor substrate 1) to obtain a bridge circuit Bx shown at a left side of FIG. 5. The piezoresistive elements (Rx1, Rx2, Rx3, Rx4) are formed at stress concentration regions of the flexible portions 13 where stress concentration occurs when the acceleration is applied in the "x" axis direction.

On the flexible portion 13 extending from the core section 12a of the weight portion 12 in a positive direction of the "y" axis, i.e., the flexible portion 13 positioned at the upper side of FIG. 3A, a pair of piezoresistive elements (Ry1, Ry3) are formed near the core section 12a, and a piezoresistive element Rz1 is formed near the frame portion 11. On the other hand, on the flexible portion 13 extending from the core section 12a of the weight portion 12 in a negative direction of the "y" axis, i.e., the flexible portion 13 positioned at the lower side of FIG. 3A, a pair of piezoresistive elements (Ry2, Ry4) are formed near the core section 12a, and a piezoresistive element Rz4 is formed near the frame portion 11. In this regard, the four piezoresistive elements (Ry1, Ry2, Ry3, Ry4) formed near the core section 12a is used to detect acceleration in the "y" axis direction. Each of the piezoresistive elements (Ry1, Ry2, Ry3, Ry4) is formed in an elongate rectangular shape as a planar shape, and disposed such that the elongate direction of the piezoresistive element is substantially the same as the longitudinal direction of the flexible portion 13. In addition, these piezoresistive elements are connected by wirings (diffusion layer wirings and metal wiring 17 formed on the sensor substrate 1) to obtain a bridge circuit By shown at a center of FIG. 5. The piezoresistive elements (Ry1, Ry2, Ry3, Ry4) are formed at stress concentration regions of the flexible portions 13 where stress concentration occurs when the acceleration is applied in the "y" axis direction.

Figure 5:
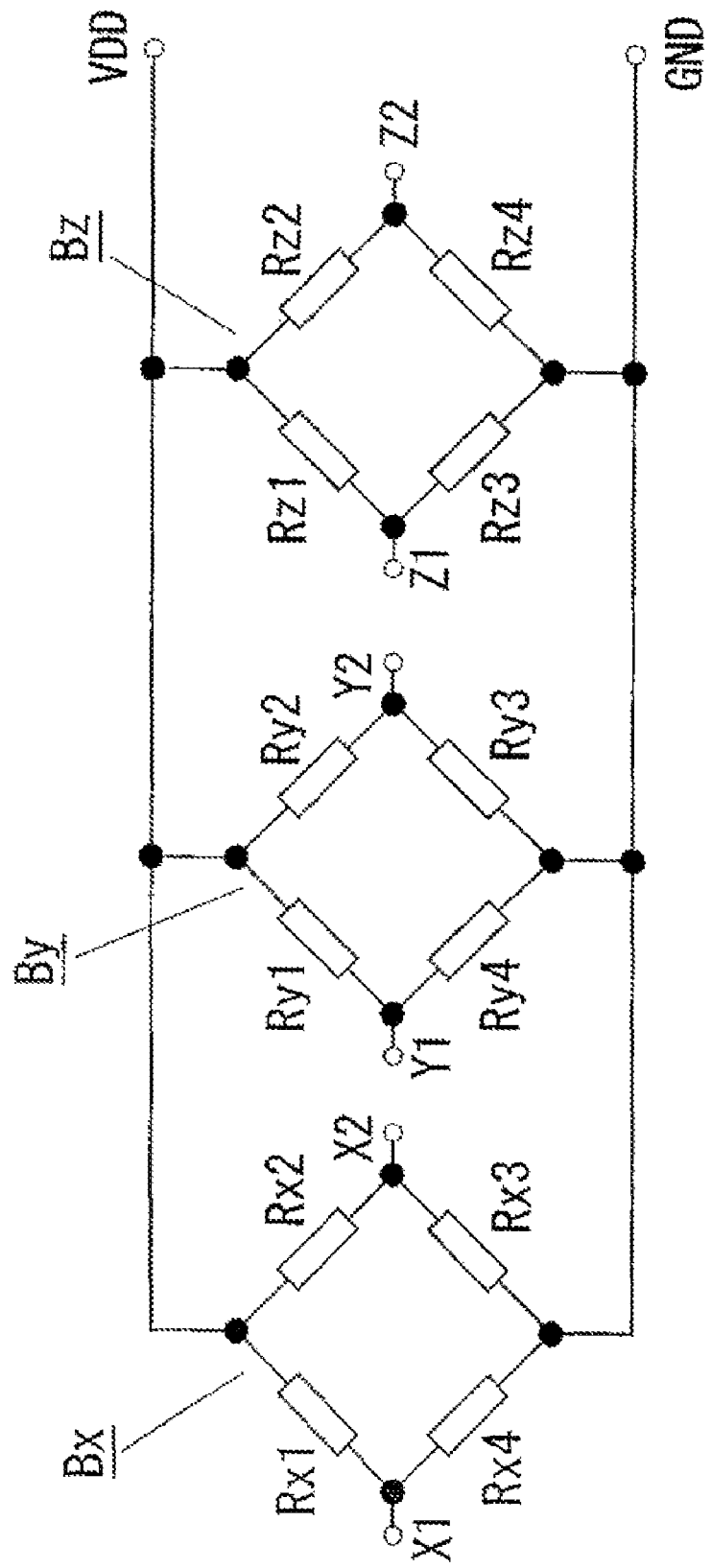
FIG. 5 is a circuit diagram of the sensor substrate.

In addition, the piezoresistive elements (Rz1, Rz2, Rz3, Rz4) formed near the frame portion 11 are used to detect acceleration in the "z" axis direction, and connected by wirings (diffusion layer wirings and metal wirings 17 formed on the sensor substrate 1) to obtain a bridge circuit Bz shown at a right side of FIG. 5. The piezoresistive elements (Rz1, Rz4) are disposed on the pair of the flexible portions 13 such that that the elongate direction of the piezoresistive element is substantially the same as the longitudinal direction of the flexible portion 13, and the piezoresistive elements (Rz2, Rz3) are disposed on another pair of the flexible portions 13 such that that the elongate direction of the piezoresistive element is substantially the same as the width (lateral) direction of the flexible portion 13.

FIG. 3A shows only a part of the metal wirings 17 on the sensor substrate 1 in the vicinity of a second metal layer 19 described later. In addition, the diffusion layer wirings are not shown in FIG. 3A.

The piezoresistive elements (Rx1 to Rx4, Ry1 to Ry4, Rz1 to Rz4) and the diffusion layer wirings are formed by doping a p-type impurity into predetermined formation sites of the silicon layer 10c at an appropriate concentration. On the other hand, the metal wirings 17 can be obtained by forming a metal film (e.g., Al film, Al alloy film or the like) on the insulating film 16 by means of sputtering or vapor deposition, and then patterning the metal film by using conventional lithography and etching technologies. The metal wirings 17 can be electrically connected to the diffusion layer wirings through contact holes formed in the insulating film 16.

Figure 6A:
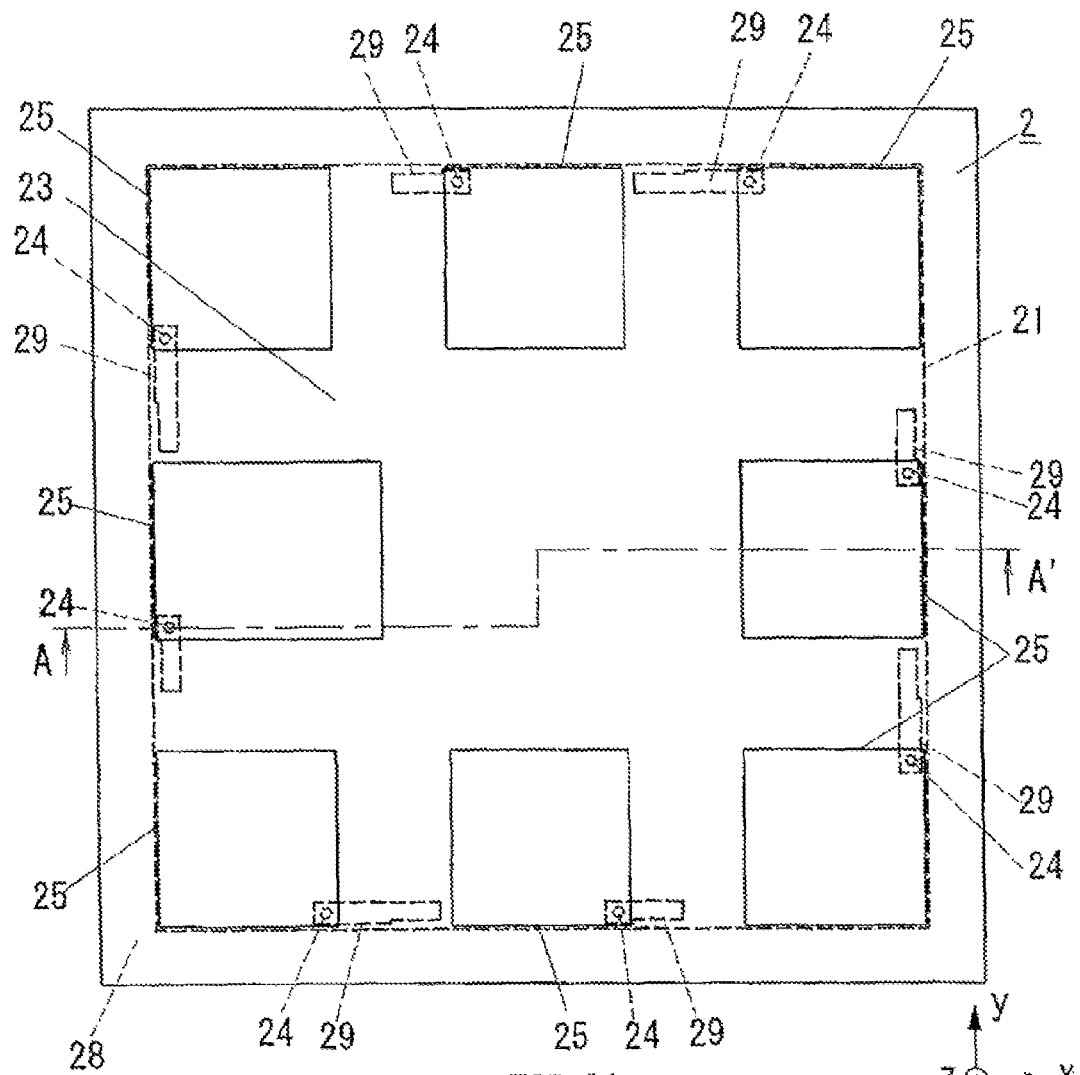
FIG. 6A is a top view of a first package substrate.
Figure 6B:
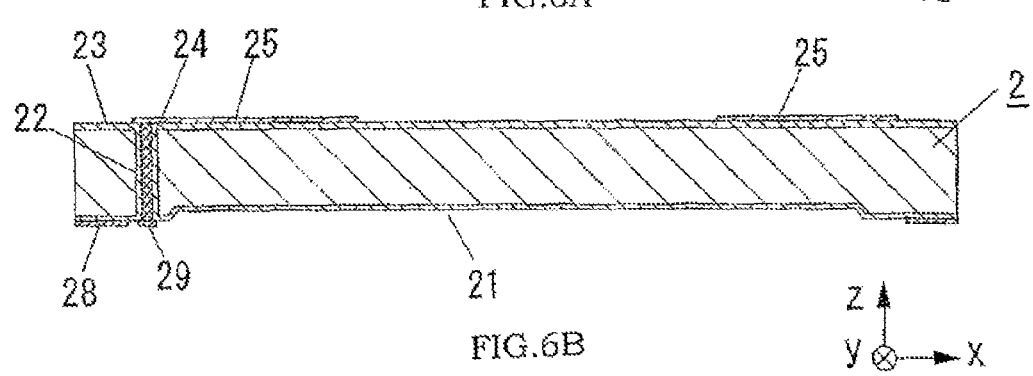
FIG. 6B is a cross-sectional view taken along the line A-A' in FIG. 6A.
Figure 7:
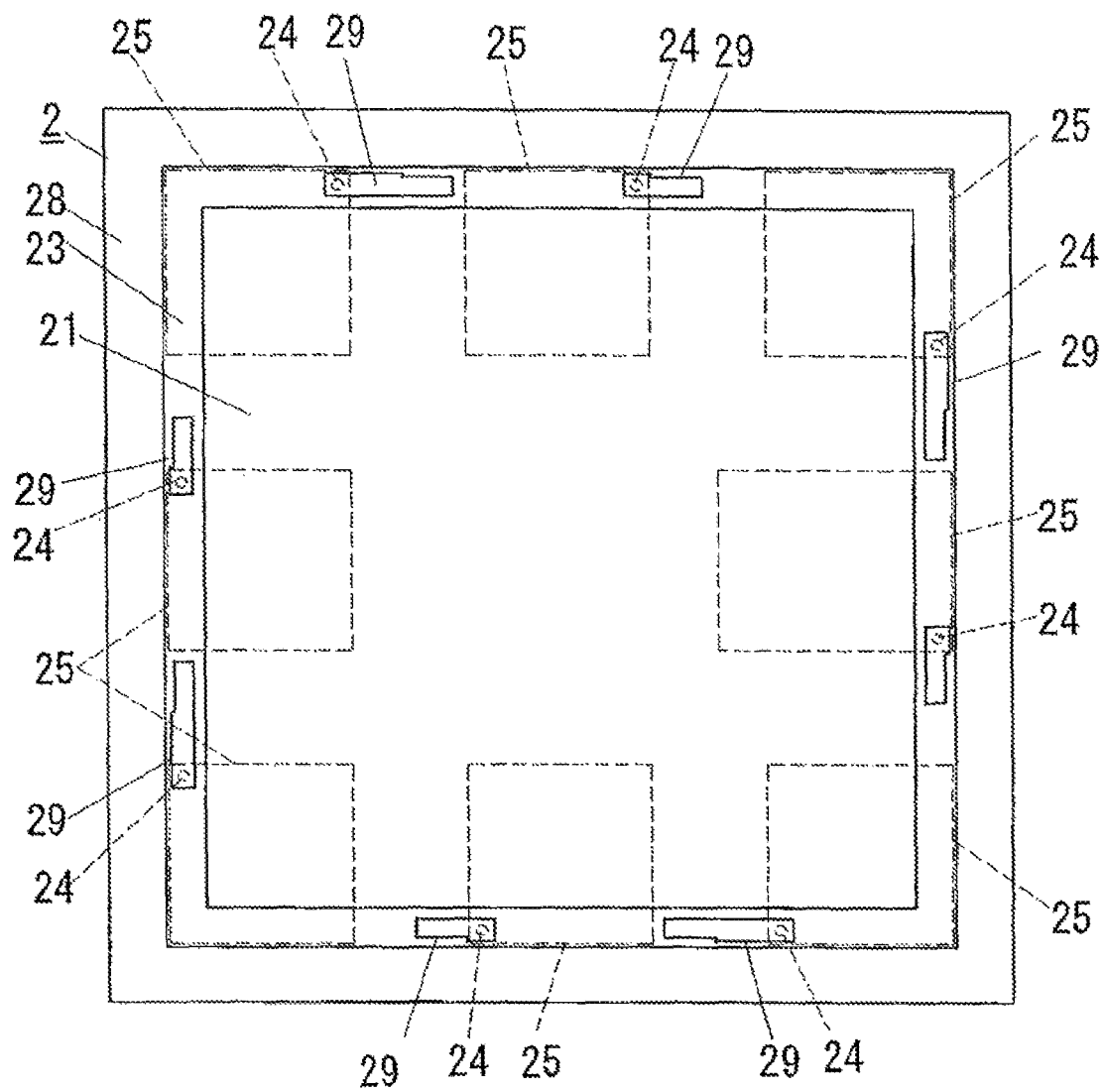
FIG. 7 is a bottom view of the first package substrate.

As shown in FIGS. 6A, 6B and 7, the first package substrate 2 is formed at a surface facing the sensor substrate 1 with a concave portion 21 for providing a space for positional displacement of the movable portion comprised of the weight portion 12 and the flexible portions 13 of the sensor substrate 1, and a plurality of through holes 22 (e.g., eight through holes) formed in the thickness direction around the concave portion 21. The outer peripheral shape of each of the sensor substrate 1 and the first package substrate 2 is a rectangular shape, and the first package substrate 2 is formed to have the same outside dimension as the sensor substrate 1.

The first package substrate 2 has an insulating film 23 formed by a heat insulating film (silicon oxide film) on the opposite surfaces in the thickness direction as well as the inner surfaces of the through holes 22. Therefore, a part of the insulating film 23 lies between a through-hole wiring 24 and the inner surface of each of the through holes 22. In this embodiment, eight through-hole wirings 24 are formed to be spaced from each other in the circumferential direction of the first package substrate 2. As a material for the through-hole wirings 24, for example, copper can be used. Alternatively, nickel may be used.

In addition, it is preferred that the through-hole wiring 24 formed in the first package substrate 2 has a tapered shape such that an area of an end portion facing the sensor substrate 1 is larger than the area of the other end portion. When the through-hole wiring is formed by performing electroplating in the tapered through hole formed in the first package substrate, a plating solution is supplied from the end portion having the larger opening area, so that a wiring formation metal precipitates from the end portion having the small opening area toward the other end portion having the large opening area. Thereby, air bubbles generated in the through hole can be easily exhausted to the outside, as compared with the case where the through hole has a constant opening area. In addition, since the plating solution is easy to put in the through hole, it is possible to prevent a reduction in metal ion concentration in the through hole, and increase the metal precipitation rate. As a result, there is an advantage that the through-hole wiring 24 having a uniform thickness can be efficiently formed. A plurality of electrodes 25 for external connection are formed on a (top) surface of the first package substrate 2 at an opposite side of the surface facing the sensor substrate 1 so as to be electrically connected with the through-hole wirings 24. The electrode 25 of the present embodiment has a rectangular outer peripheral shape.

Figure 8:
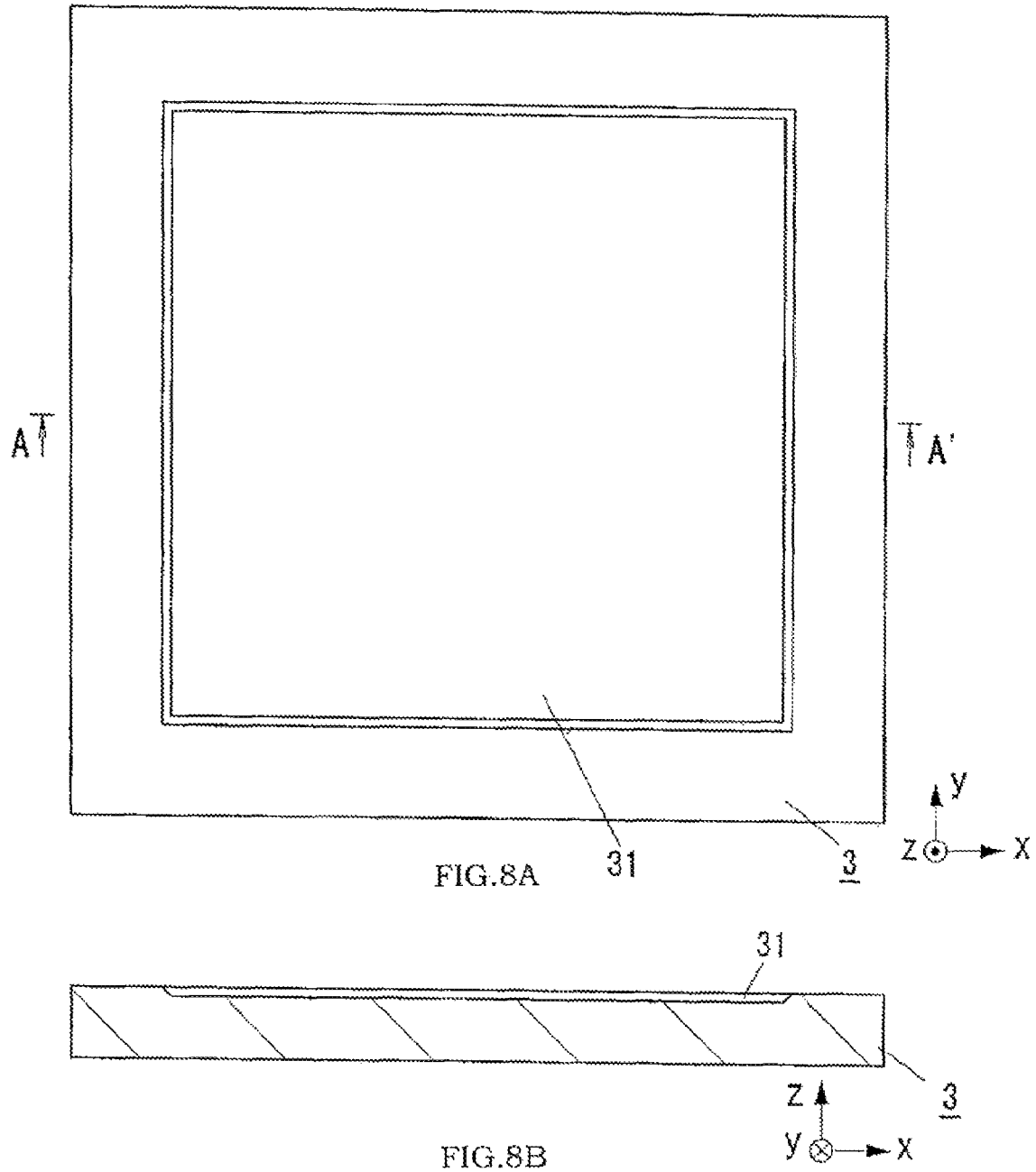
FIGS. 8A and 8B are respectively top and cross-sectional views of a second package substrate.

As shown in FIGS. 8A and 8B, the second package substrate 3 is formed at a surface facing the sensor substrate 1 with a concave portion 31 having a predetermined depth (e.g., 5 µm to 10 µm) for providing a space for positional displacement of the weight portion 12. The concave portion 31 can be formed by using conventional lithography and etching technologies. Each of the sensor substrate 1 and the second package substrate 3 has a rectangular outer peripheral shape. The second package substrate 3 is formed to have the same outside dimension as the sensor substrate 1.

When the thickness of a portion of the support substrate 10a used to form the core section 12a and the weights 12b of the weight portion 12 is determined to be smaller than the thickness of another portion of the support substrate 10a used to form the frame portion 11 by a dimension corresponding to an allowable positional displacement amount of the weight portion 12 in the thickness direction of the sensor substrate 1, a clearance for enabling the positional displacement of the weight portion 12 can be obtained between the weight portion 12 and the second package substrate 3 without the formation of the concave portion 31 in the second package substrate 3.

Figure 9:
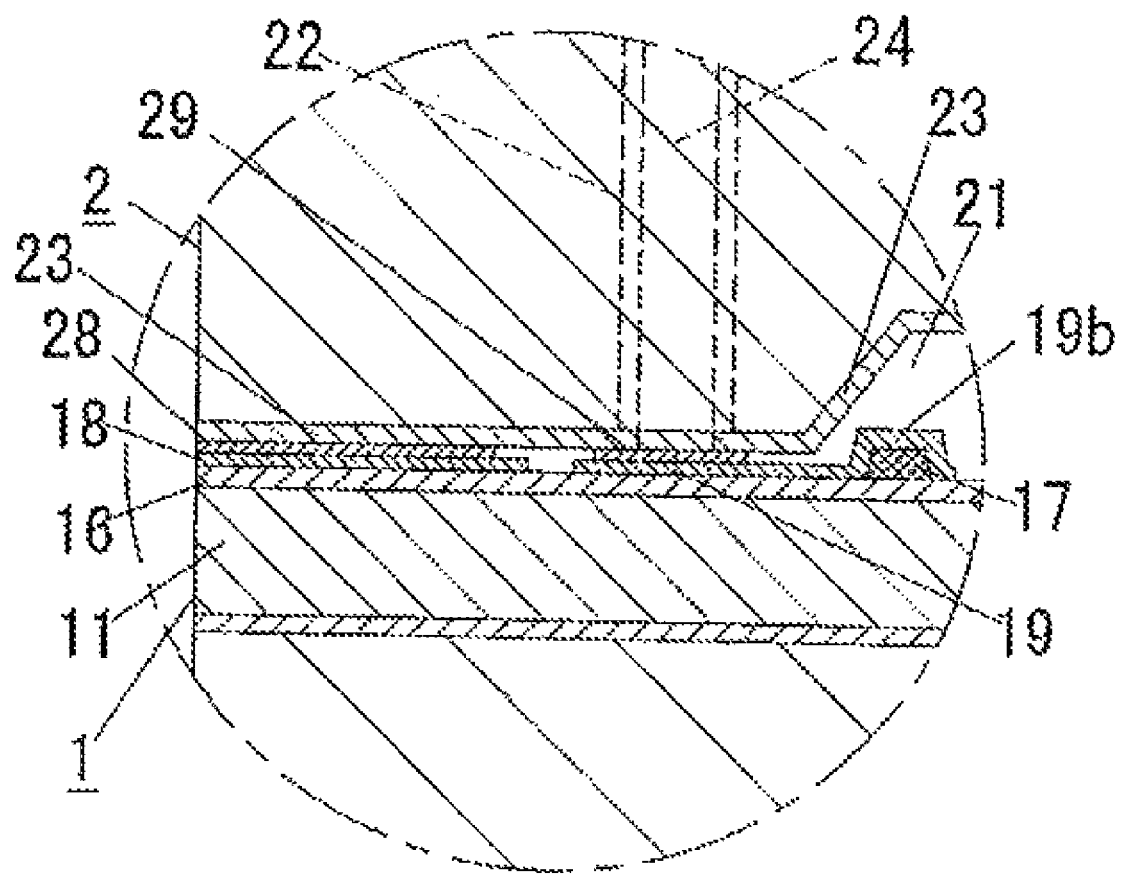
FIG. 9 is a schematic enlarged cross-sectional view of a bonding portion between the sensor substrate and the first package substrate.

Next, a bonding portion between the sensor substrate 1 and the first package substrate 2 is explained. On the frame portion 11 of each of the acceleration sensor units, a first metal layer 18 is formed at a side facing the first package substrate 2 over the entire circumference of the frame portion so as to surround the movable portion comprised of the weight portion 12 and the flexible portions 13. The bonding portion between the sensor substrate 1 and the first package substrate 2 is formed, as shown in FIG. 9, by a solid-phase direct bonding without diffusion between an activated surface of the first metal layer 18 of each of the acceleration sensor units and an activated surface of a frame-like metal layer 28 formed on a corresponding region of the first package substrate 2. This solid-phase direct bonding can be obtained by pressing the activated surfaces to each other at room temperature.

In addition, the first package substrate 2 has a plurality of wiring layers 29, which are formed at an inner side of the frame-like metal layer 28 and around the concave portion 21, and electrically connected to the through-hole wirings 24. For example, the number of the wiring layers 29 formed in the present embodiment is eight. Each of the wiring layers 29 is connected at an end portion of its longitudinal direction to the through-hole wiring 24. The wiring layer 29 is positioned at a side closer to the weight portion 12 than the first metal layer 18 of the sensor substrate 1, and also electrically connected to a second metal layer 19 formed on the frame portion 11. The connection between the second metal layer 19 and the wiring layer 29 is positioned at an outer side of the metal wiring 17 on the sensor substrate 1.

On the surface facing the first package substrate 2 of the sensor substrate 1, an insulating film 16 is formed, which is comprised of a laminate film of a silicon oxide film and a silicon nitride film on the silicon layer 10c. The first metal layer 18, the second metal layers 19 and the metal wirings 17 are formed on the insulating film 16.

The first metal layer 18 and the metal layer 28 are formed by use of the same metal material. For example, Au, Cu or Al is preferably used as the metal material. It is particularly preferred to use Au. The metal material used in the present embodiment is Au. To achieve an improvement in adhesion between the first metal layer 18 of Au and the insulating film 16, a Ti film is formed as an intermediate layer therebetween. In other words, the first metal film 18 is comprised of a laminate film of the Ti film formed on the insulating film 16 and the Au film formed on the Ti film.

Similarly, the second metal layer 19 and the wiring layer 29 are formed by use of the same metal material. For example, Au, Cu or Al is preferably used as the metal material. It is particularly preferred to use Au. The metal material used in the present embodiment is Au. To achieve an improvement in adhesion between the second metal layer 19 of Au and the insulting film 16, a Ti film is formed as an intermediate layer therebetween. In other words, the second metal film 19 is comprised of a laminate film of the Ti film formed on the insulating film 16 and the Au film formed on the Ti film.

With respect to each of the first metal layer 18 and the second metal layer 19, a thickness of the Ti film can be preferably set in a range of 15 to 50 nm. In the present embodiment, a thickness of the Au film is set to 500 nm, and a thickness of the metal wiring 17 is set to 1 μm. These thickness values are illustrative only, and the present invention is not limited to them. In the case of using the Au film, it is preferred that the thickness is not larger than 500 nm from the viewpoint of improving yields in the bonding process. The Au film may be formed by use of a gold material containing an impurity other than pure gold. In the present embodiment, the Ti film is formed as the adhesive layer for improving the adhesion between the Au film and the insulating film 16. In place of the Ti film, Cr, Nb, Zr, TiN, TaN or the like may be used as the material for the adhesive layer.

As described above, when the first metal layer 18 and the second metal layer 19 are formed by use of the same metal material, it is effective to achieve a reduction in production cost because those metal layers having substantially the same thickness can be formed simultaneously. That is, since the first metal layer 18 and the second metal layer 19 are formed to be flush with each other on the sensor substrate 1, and the metal layer 28 and the wiring layer 29 are formed to be flush with each other on the first package substrate 2, it becomes possible to apply a uniform pressure to the bonding interface between the sensor substrate 1 and the first package substrate 2. Consequently, the solid-phase direct bondings between the first metal layer 18 and the metal layer 28 and the solid-phase direct bonding between the second metal layer 19 and the wiring layer 29 can be obtained with stable quality.

Figure 10A:
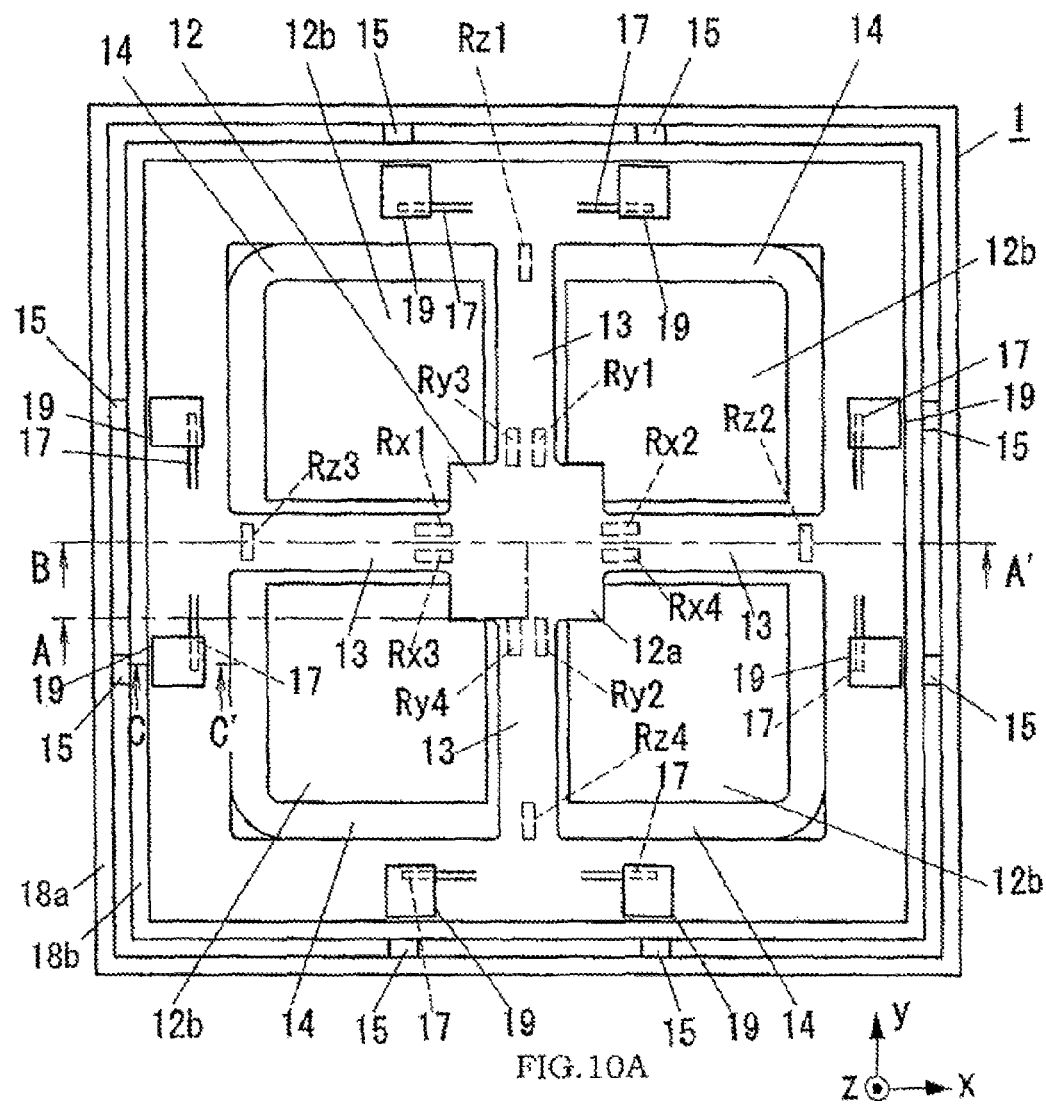
FIG. 10A is a top view of the sensor substrate according to a modification of the present embodiment.
Figure 10B:
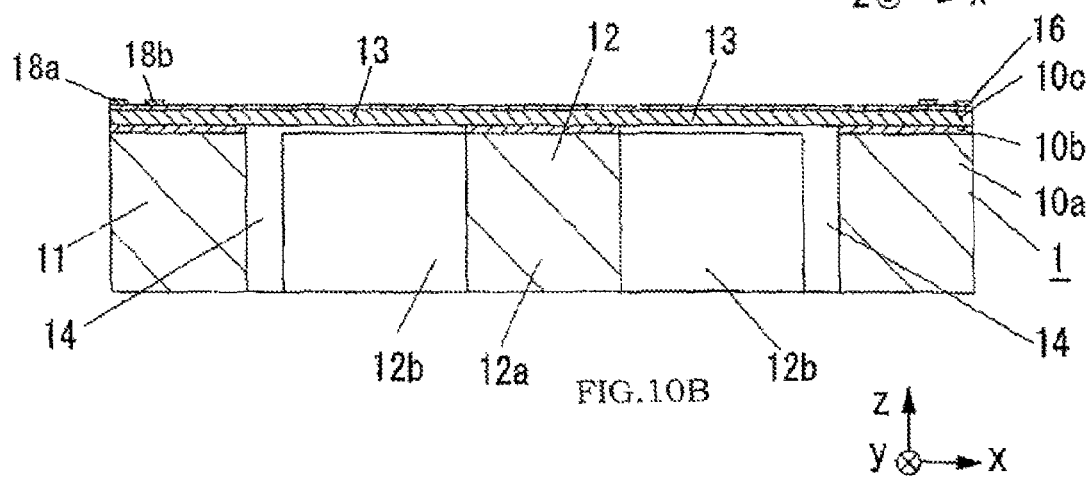
FIG. 10B is a cross-sectional view taken along the line B-A' in FIG. 10A.
Figure 11A:
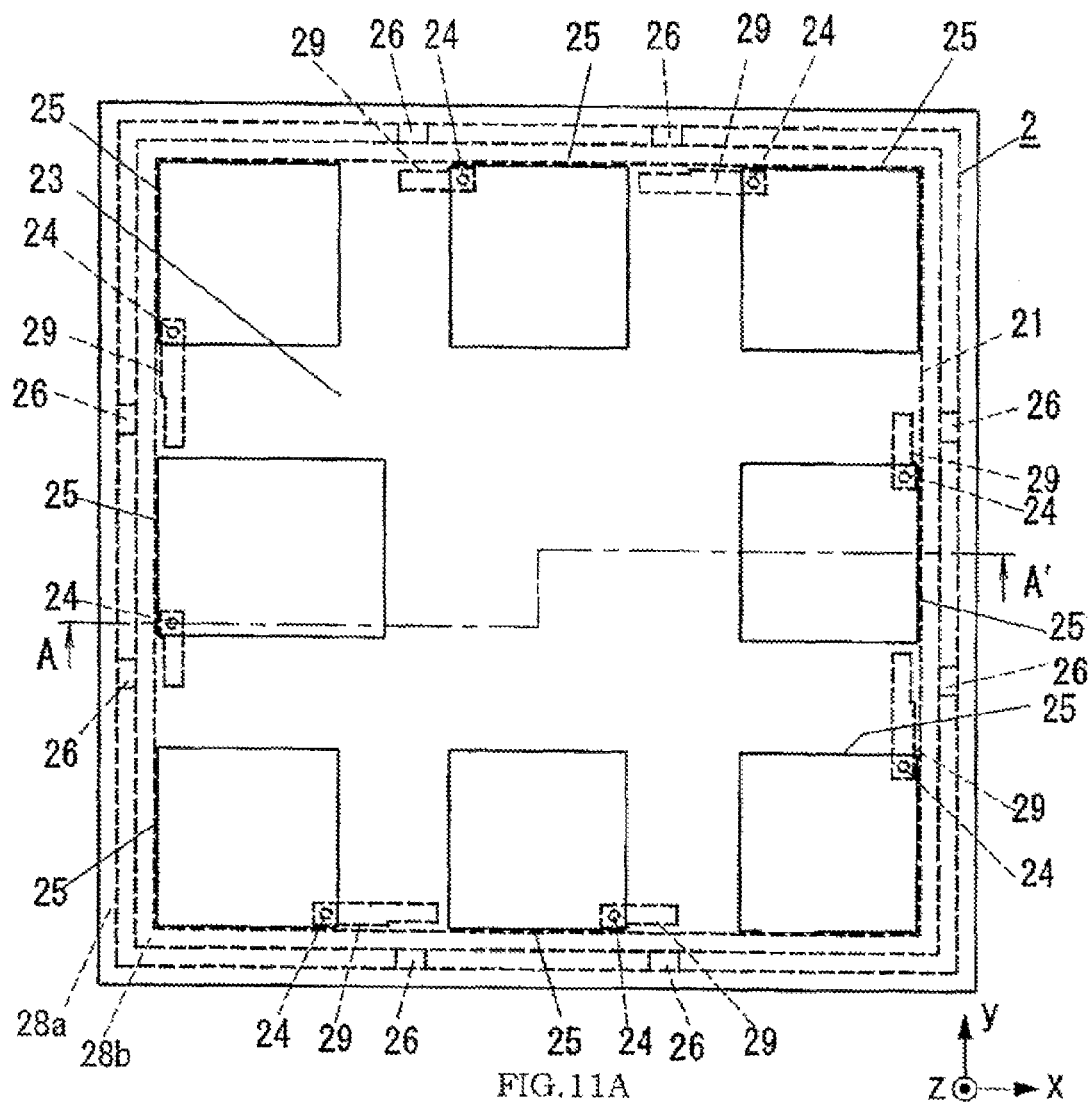
FIG. 11A is a top view of the first package substrate according to a modification of the present embodiment.
Figure 11B:
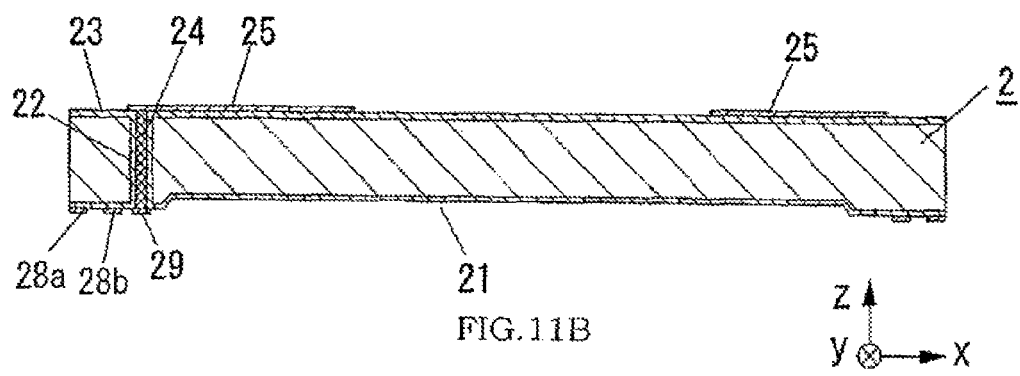
FIG. 11B is a cross-sectional view taken along the line A-A' in FIG. 11A.
Figure 12:
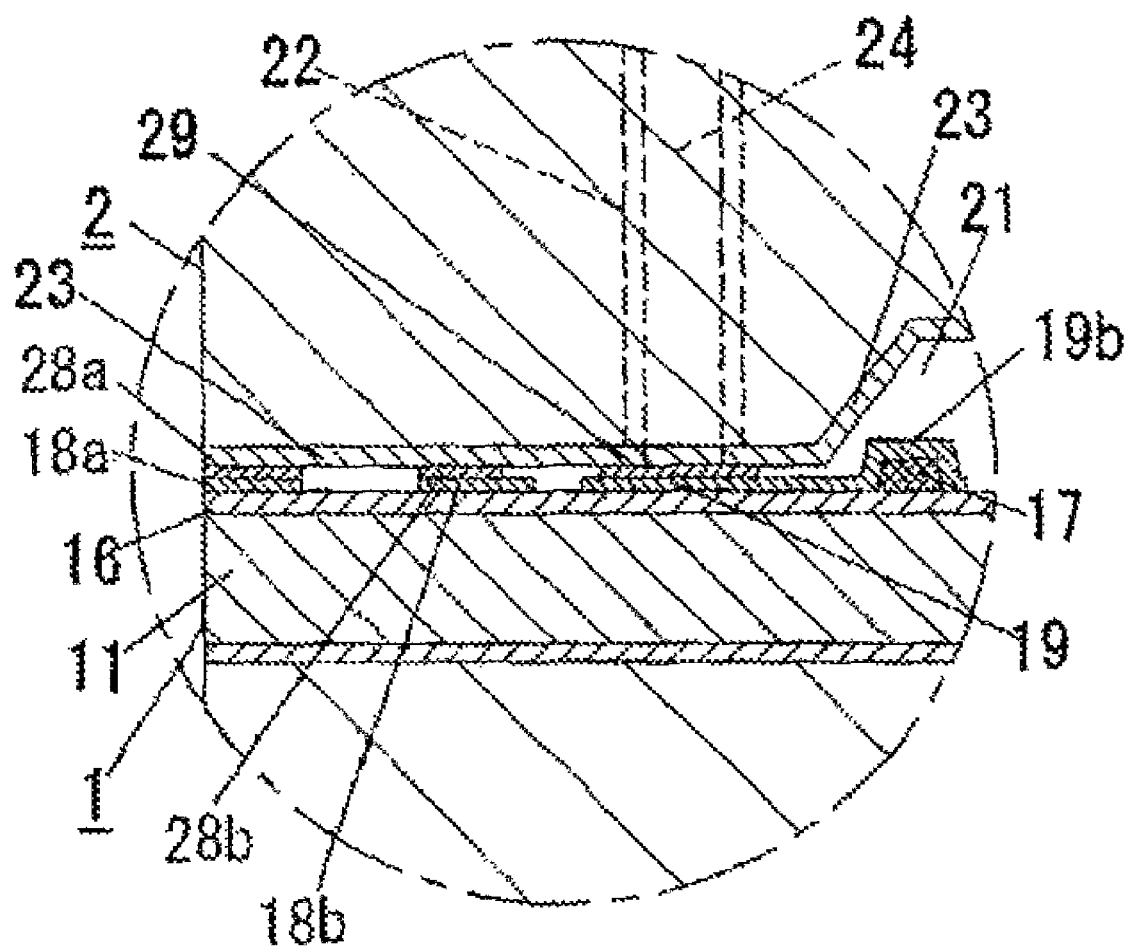
FIG. 12 is a schematic enlarged cross-sectional view of a bonding portion between the sensor substrate of FIG. 10A and the first package substrate of FIG. 11A.

In addition, as shown in FIGS. 10A and 10B, the first metal layer 18 may be composed of a ring-like outer metal layer 18a formed over the entire circumference of the frame portion 11 so as to surround the weight portion 12, and a ring-like inner metal layer 18b formed at an inner side of the outer metal layer 18a over the entire circumference of the frame portion 11 so as to surround the weight portion 12. In this case, as shown in FIGS. 11A and 11B, it is also preferred that the metal layer 28 of the first package substrate 2 is composed of a ring-like outer metal layer 28a and a ring-like inner metal layer 28b disposed at an inner side of the outer metal layer 28a, which are formed in a face-to-face relation with the first metal lay 18. Alternatively, the metal layer 28 of the first package substrate 2 may be formed by a single metal layer, which has a width dimension determined so as to straddle between the outer metal layer 18a and the inner metal layer 18b. Thus, when forming double bonding between the first metal layer 18 and the metal layer 28, as shown in FIG. 12, it is possible to further improve the effect of airtightly sealing the interior (i.e., the movable portion) of the acceleration sensor unit. In FIG. 12, a connecting portion 19b with the metal wiring 17 is located in the concave 21 of the first package substrate 2, and the second metal layer 19 is electrically connected to this connecting portion 19b.

In FIG. 10A, the numeral 15 designates an auxiliary sealing layer extending between the outer metal layer 18a and the inner metal layer 18b. The auxiliary sealing layer 15 is provided at plural locations spaced from each other in the circumferential direction of the frame portion 11 by a predetermined distance. In addition, as shown in FIG. 11A, auxiliary sealing layers 26 are formed on the first package substrate 2 at positions corresponding to the auxiliary sealing layers 15 of the sensor substrate 1. Therefore, when the first package substrate 2 is bonded to the sensor substrate 1, the solid-phase direct bonding between activated surfaces of the auxiliary sealing layers (15, 26) is also obtained. Moreover, the following effect is expected by the formation of the auxiliary sealing layers (15, 26). For example, when a foreign substance exists on the outer metal layer 28a, the airtightness between the outer metal layers (18a, 28a) may deteriorate. Alternatively, when another foreign substance exists on the inner metal layer 28b, the airtigtness between the inner metal (18b, 28b) may deteriorate. In these cases, it is expected to be difficult to airtightly seal the interior of the sensor device. However, when forming the bonding between the auxiliary sealing layers (15, 26), a plurality of airtight spaces can be obtained between the outer metal layer 18a and the inner metal layer 18b. That is, when a region where a reduction in airtightness of the bonding between the outer metal layers (18a, 28a) occurs due to the foreign substance is located away from the region where a reduction airtightness of the bonding between the inner metal layers (18b, 28b) occurs due to another foreign substance, these regions can be spatially shielded from each other by the bonding between the auxiliary sealing layers (15, 26). In brief, the airtightness brought by the bonding between the outer metal layers (18a, 28a) and the bonding between the inner metal layers (18b, 28b) can be further reliably improved by the bonding between the auxiliary sealing layers (15, 26).

In the present embodiment, as described above, the first metal layer 18 is formed on the surface facing the first package substrate 2 over the entire circumference of the frame portion 11 so as to surround the weight portion 12, and the metal layer 28 is formed at the corresponding region on the first package substrate 2. Alternatively, it is preferred that a Si layer or a $SiO_2$ layer is formed in place of the first metal layer 18, and a Si layer or a $SiO_2$ layer is formed in place of the metal layer 28. In brief, the bonding between the sensor substrate 1 and the first package substrate 2 may be formed by any one of a solid-phase direct bonding between Si and Si, a solid-phase direct bonding between Si and $SiO_2$, and a solid-phase direct bonding between $SiO_2$ and $SiO_2$.

To form the solid-phase direct bonding without diffusion between the sensor substrate 1 and the first package substrate 2, activated surfaces of the first metal layer 18 and the metal layer 28 are previously formed prior to the bonding step. In the present embodiment, these activated surfaces are obtained by irradiating an atomic beam, an ion beam or a plasma of argon in vacuum to clean up and activate surfaces of the first metal layer 18 and the metal layer 28. Similarly, the activated surfaces can be formed on the second metal layer 19 and the wiring layer 29. Subsequently, the room-temperature bonding method described above is performed. That is, the direct bonding between the first metal layer 18 and the metal layer 28 and the direct bonding between the second metal layer 19 and the wiring layer 29 are simultaneously formed by applying an appropriate load at room temperature.

Next, the bonding portion between the sensor substrate 1 and the second package substrate 3 is explained. The frame portion 11 of each of the acceleration sensor units has a surface activated region formed on the sure facing the second package substrate 3 over the entire circumference of the frame portion 11 by a surface activation treatment. The bonding portion between the sensor substrate 1 and the second package substrate 3 is formed by the solid-phase direct bonding without diffusion between the surface activated region of each of the acceleration sensor units and a surface activated region formed on the corresponding surface of the second package substrate 3 by the surface activation treatment. This solid-phase direct bonding can be obtained by pressing the surface activated regions to each other at room temperature. Therefore, the bonding interface in this case is formed by the solid-phase direct bonding between Si and Si. Alternatively, a $SiO_2$ layer may be formed on one of the sensor substrate 1 and the second package substrate 3 to obtain the solid-phase direct bonding between Si and $SiO_2$. In addition, the $SiO_2$ layer may be formed on both of the sensor substrate 1 and the second package substrate 3 to obtain the solid-phase direct bonding between $SiO_2$ and $SiO_2$. Furthermore, it is also preferred to use the solid-phase direct bonding between surface activated regions of a metal material such as the direct bonding between Au and Au described above. Thus, if necessary, the solid-phase direct bonding can be formed between the sensor substrate 1 and the first package substrate 3, as in the case of forming the solid-phase direct bonding between the sensor substrate 1 and the first package substrate 2.

To manufacture the wafer level package structure 100, it is desired that the second package substrate 3 is directly bonded to the sensor substrate 1, and then the first package substrate 2 is directly bonded to the sensor substrate 1 from the viewpoint of effectively applying the pressure to the bonding interface.

Figure 13A:
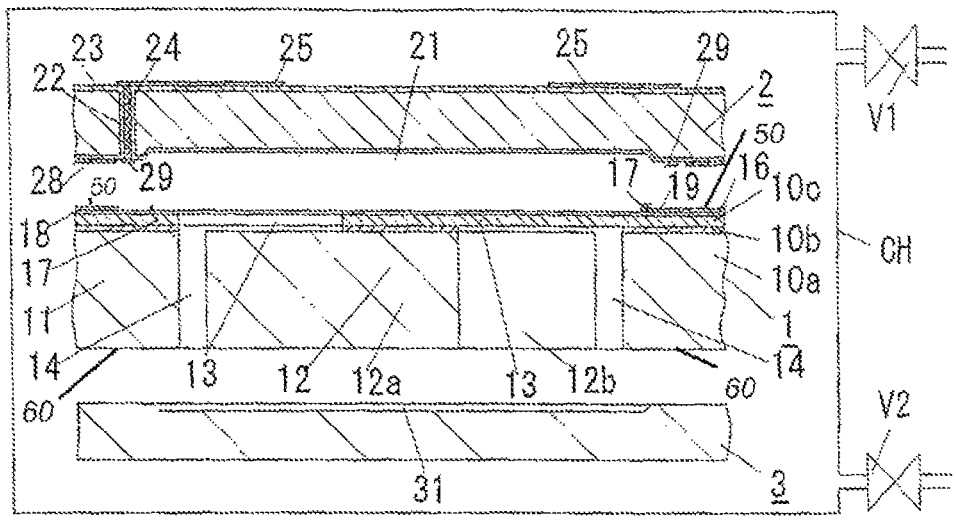
FIG. 13A is a cross-section view showing a surface activation step.
Figure 13B:
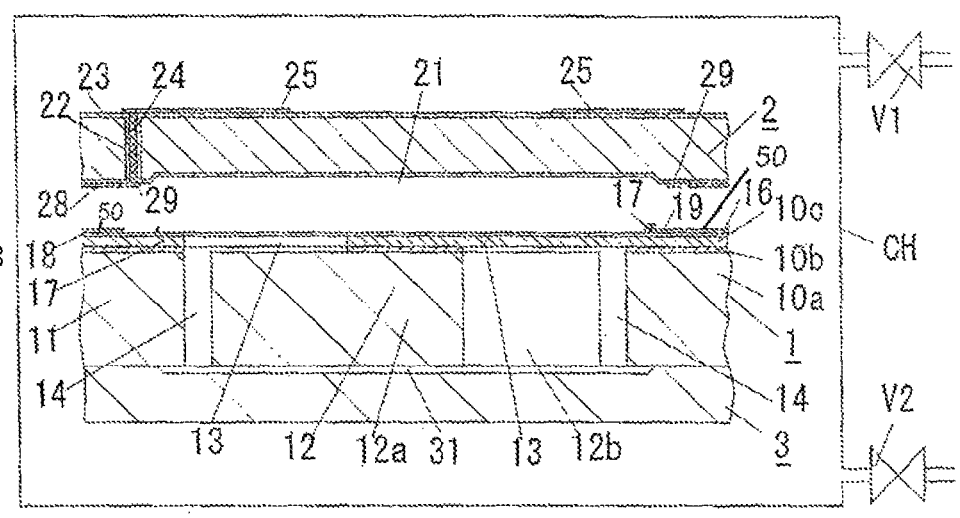
FIG. 13B is a cross-sectional view showing an atmosphere adjusting step.
Figure 13C:
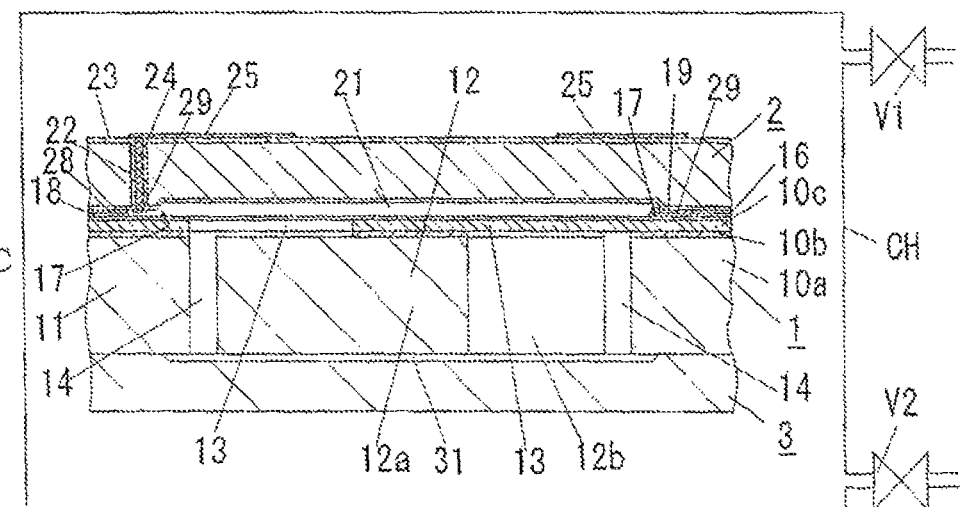
FIG. 13C is a cross-sectional view showing a room-temperature bonding step.

Referring to FIGS. 13A to 13C, the bonding step between the sensor substrate 1 and each of the first package substrate 2 and the second package substrate 3 is concretely explained below. First, as shown in FIG. 13A, the sensor substrate 1, the first package substrate 2 and the second package substrate 3 are placed in a chamber CH, and the air in the chamber is exhausted to be not greater than a predetermined degree of vacuum (e.g., $1 \times 10^{-5}$ Pa). Subsequently, under a reduced atmosphere, surfaces of the sensor substrate 1, the first package substrate 2 and the second package substrate 3 are cleaned up by means of sputter etching, and then a surface activation treatment is performed. That is, the surface activation treatment is performed to the surfaces of the first and second metal layers (18, 19) of the sensor substrate 1, the surface of the frame portion 11 to be bonded to the second package substrate 3, the metal layers (28, 29) of the first package substrate 2, and the surface of the second package substrate 3 to be bonded to the sensor substrate. With this treatment, the first and second metal layers (18, 19) of the sensor substrate I are formed with first surface-activated regions 50 in their treated surfaces, respectively. As well, the sensor substrate 1 is formed with second surface-activated regions 60 in its treated surface. As the surface activation treatment, an argon ion beam is irradiated to the surfaces to be treated for a predetermined time period (e.g., 300 seconds). During the surface activation treatment, the internal pressure of the chamber is maintained at a lower degree of vacuum (e.g., approximately $1 \times 10^{-2}$ Pa) than the above-described degree of vacuum. In place of the argon ion beam, an atomic beam or plasma of argon may be used. The gas used for the surface activation treatment is not limited to argon. Alternatively, an inert gas such as nitrogen and helium may be used.

After the surface activation treatment, an atmosphere adjusting step is performed to adjust the interior of the chamber to a desired atmosphere for the bonding step between the sensor substrate 1 and each of the first and second package substrates (2, 3), as shown in FIG. 13B. By this step, the interior (i.e., the movable portion) of each of the acceleration sensor units can be maintained in the desired atmosphere after the bonding step. For example, in the present embodiment where the acceleration sensor units are formed, the interior of the chamber is controlled to an inert-gas atmosphere such as argon at atmospheric pressure to improve frequency characteristics and impact resistance by damping effects. Such atmosphere control can be carried out by opening and closing a gas introduction valve V1 and a gas exhaust valve V2 of the chamber. To prevent that contamination of the activated surfaces is caused by contact with the outside air, it is particularly preferred that the atmosphere adjusting step and the bonding step are continuously performed in the chamber without exposure to the outside.

After the interior of the chamber is controlled to the desired atmosphere, the direct bonding between the activated surfaces (Au—Au surfaces) of the first metal layer 18 and the metal layer 28 of the first package substrate 2, the direct bonding between the activated surfaces (Au—Au solid-phase bonding) of the second metal layer 19 and the wiring layer 29 of the first package substrate 2, and the direct bonding between the activated surfaces (Si—Si solid-phase bonding) of the frame portion 11 of the sensor substrate 1 and the second package substrate 3 are formed at room temperature by applying an appropriate load (e.g., 300 N), as shown in FIG. 13C. Thus, the solid-phase direct bonding having substantially no residual stress at the bonding interface can be obtained under the condition that the interior of the sensor unit is maintained in the desired atmosphere.

Since the wafer level package structure 100 of the present embodiment has the direct bonding between the sensor substrate 1 and the first package substrate 2 and the direct bonding between the sensor substrate 1 and the second package substrate 3, which are formed according to a low-temperature process such as the room-temperature bonding method, there is an advantage that the piezoresistive elements (Rx1 to Rx4, Ry1 to Ry4, Rz1 to Rz4) become hard to receive the influence of thermal stress, as compared with the case of performing the bond step with a heat treatment such as reflow soldering. In addition, it is possible to reduce the process temperature, and achieve a simplification of he manufacturing process.

In addition, when the sensor substrate 1 is formed by use of the SOI wafer, and each of the first and second package substrates (2, 3) is formed by use of the Si wafer, it is possible to reduce stress occurring in the flexible portions 13 due to a difference in linear expansion coefficient therebetween, and the influence of the stress resulting from the difference in linear expansion coefficient on output signals of the above-described bridge circuits (Bx, By, Bz). As a result, variations in sensor characteristics be minimized. Each of the substrates may be formed by a semiconductor material other than silicon, When dicing the thus obtained wafer level package structure 100 into a size of the acceleration sensor unit formed on the sensor substrate 1, the sensor substrate 1 and the first and second package substrates (2, 3) can be simultaneously cut to have the same outside dimension. Therefore, it is possible to efficiently obtain compact chip size packages.

An operation of the acceleration sensor device obtained from the wafer level package structure of the present embodiment is briefly explained below.

Under the condition that no acceleration is applied to the sensor substrate 1, when acceleration is applied to the sensor substrate 1 in the positive direction of the "x" axis, a positional displacement of the weight portion 12 relative to the frame portion 11 occurs due to an inertia force of the weight portion 12 acting in the negative direction of the "x" axis. As a result, the pair of the flexible portions 13 where the longitudinal direction corresponds to the "x" axis direction elastically deforms, so that resistance values of the piezoresistive elements (Rx1 to Rx4) on the flexible portions 13 change. In this case, the piezoresistive elements (Rx1, Rx3) receive a tensile stress, and the piezoresistive elements (Rx2, Rx4) receive a compression stress. In general, when the piezoresistive element receives the tensile stress, the resistance value (resistivity) increases, and when the piezoresistive element receives the compression stress, the resistance value (resistivity) decreases. Therefore, in this case, the resistance values of the piezoresistive elements (Rx1, Rx3) increase, and the resistance values of the piezoresistive elements (Rx2, Rx4) decrease. When a constant DC voltage is applied from an external power source to between a pair of input terminals (VDD, GND) shown in FIG. 5, a potential difference between output terminals (X1, X2) of the bridge circuit Bx shown at the left side in FIG. 5 changes depending on a magnitude of the acceleration in the "x" axis direction.

Similarly, when acceleration is applied to the sensor substrate 1 in the "y" axis direction, a potential difference between output terminals (Y1, Y2) of the bridge circuit By shown at a center in FIG. 5 changes depending on a magnitude of the acceleration in the "y" axis direction. In addition, when acceleration is applied to the sensor substrate 1 in the "z" axis direction, a potential difference between output terminals (Z1, Z2) of the bridge circuit Bz shown at the right side in FIG. 5 changes depending on a magnitude of the acceleration in the "z" axis direction. Therefore, the sensor substrate 1 is capable of detecting the acceleration applied to the sensor substrate 1 with respect to each of the "x" axis direction, the "y" axis direction and the "z" axis direction by detecting a change in output voltage of each of the bridge circuits (Bx, By, Bz). In the present embodiment, the movable portion is composed of the weight portion 12 and the flexible portions 13, and the sensing portion is formed by the piezoresistive elements (Rx1 to Rx4, Ry1 to Ry4, Rz1 to Rz4), which are gauge resistances on the sensor substrate 1.

By the way, as shown in FIG. 5, the sensor substrate 1 has the two input terminals (VDD, GND) shared by the three bridge circuits (Bx, By, Bz), the two output terminals (X1, X2) of the bridge circuit Bx, the two output terminals (Y1, Y2) of the bridge circuit By, and the two output terminals (Z1, Z2) of the bridge circuit Bz. These input terminals (VDD, GND) and output terminals (X1, X2, Y1, Y2, Z1, Z2) are formed on the surface facing the first package substrate 2 by the second metal layers 19, and electrically connected to the through-hole wirings 24 formed in the first package substrate 2. That is, in the present embodiment, the second metal layers 19 are formed at eight locations on the sensor substrate 1, and eight through-hole wiring 24 are formed in the first package substrate 2. Each of the second metal layers 19 formed at the eight locations is configured in a rectangular outer peripheral shape (a square outer peripheral shape in the present embodiment). In addition, the second metal layers 19 are arranged away from each other in the circumferential direction of the frame portion 11. In the present embodiment, a pair of the second metal layers 19 is disposed at each of four sides of the frame portion 11 having the rectangular shape.

Second Embodiment

Figure 14A:
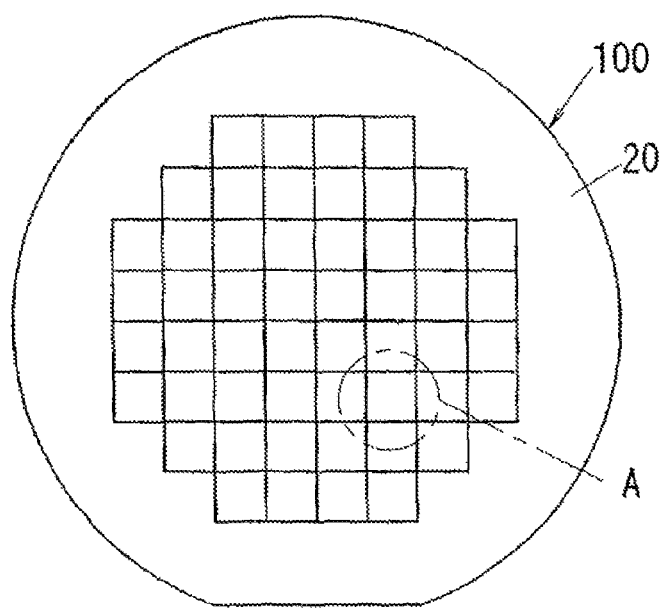
FIGS. 14A and 14B are respectively schematic plan and side views of a wafer level package structure according to a second embodiment.
Figure 14B:
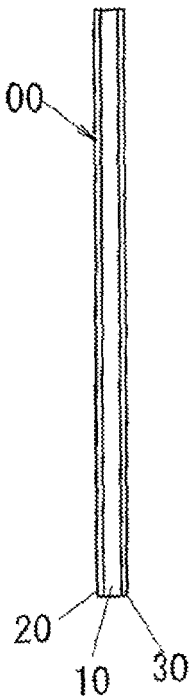
Figure 14C:
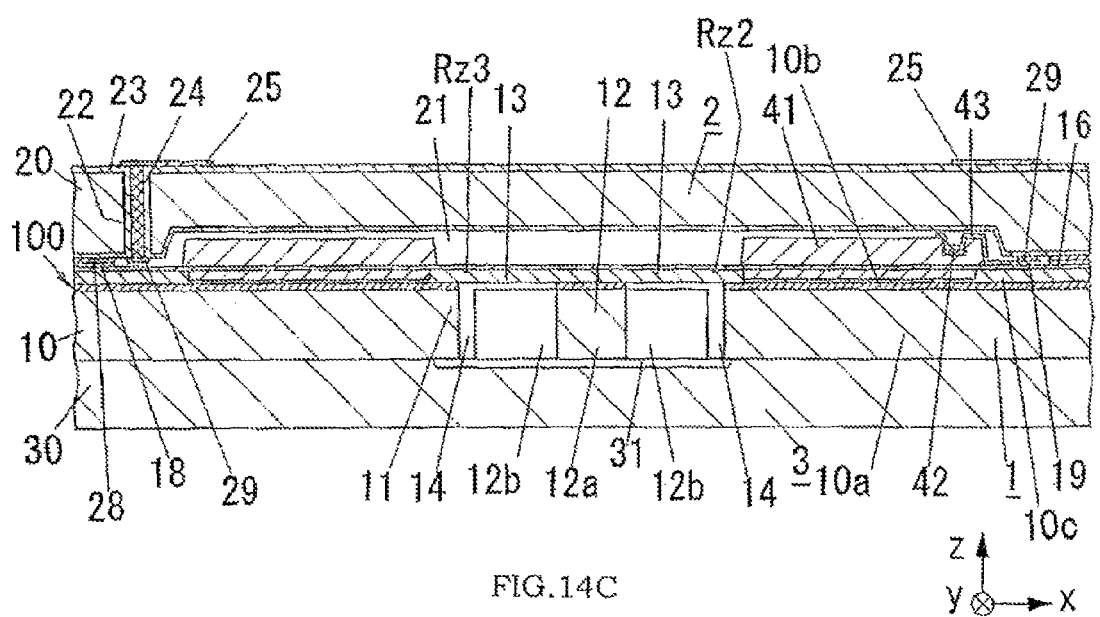
FIG. 14C is a schematic cross-sectional view of a sensor device in the wafer level package structure.

As shown in FIGS. 14A to 14C, a wafer level package structure of the present embodiment is substantially the same as that of the first embodiment except that the sensor substrate 1 has an IC region E2 other than an acceleration sensor unit, and the IC region E2 comprises an integrated circuit (i.e., CMOS IC) using CMOS and operable in collaboration with the piezoresistive elements (Rx1 to Rx4, Ry1 to Ry4, Rz1 to Rz4) of gauge resistances (i.e., a sensing portion). The integrated circuit is formed by integrating a signal processing circuit configured to execute signal processing such as amplification, offset adjustment and temperature compensation to output signals of the bridge circuits (Bx, By, Bz) explained in the first embodiment, and an EEPROM for storing data used in the signal processing circuit. Therefore, in the following explanation, the same components as those in the first embodiment are denoted by the same reference numerals, and the duplicate explanation will be omitted.

Figure 15A:
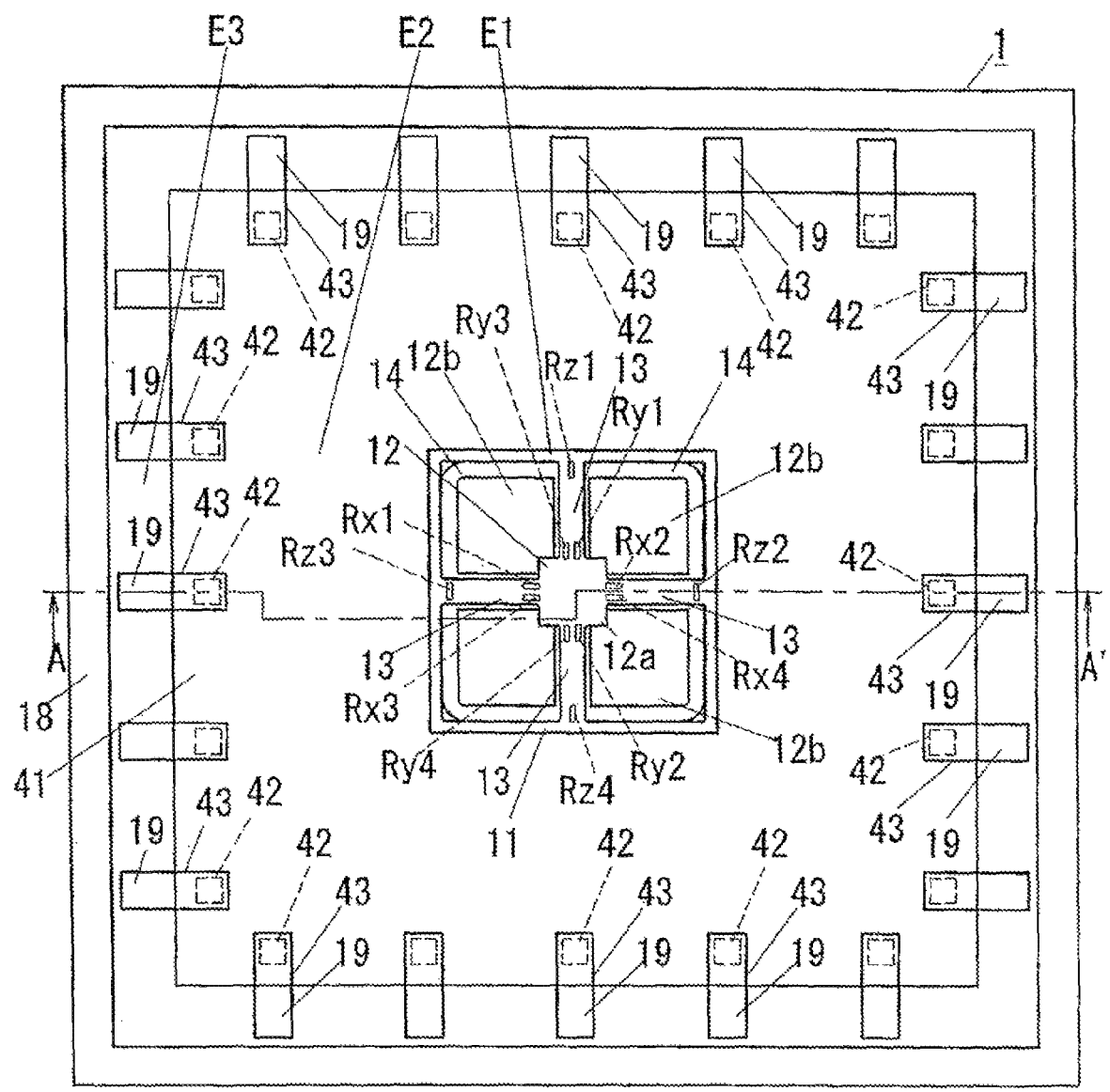
FIG. 15A is a top view of a sensor substrate.
Figure 15B:
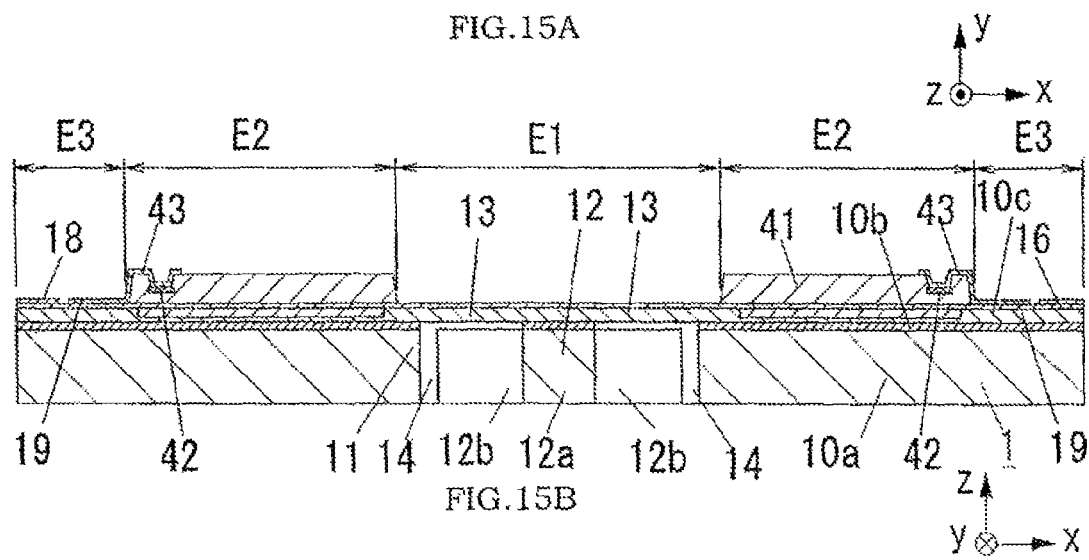
FIG. 15B is a cross-sectional view taken along the line A-A' in FIG. 15A.

As shown in FIGS. 15A and 15B, the sensor substrate 1 of the present embodiment is formed with a sensor region E1 comprising a part of the frame portion 11 explained in the first embodiment, the with portion 12, the flexible portions 13, and the piezoresistive elements (Rx1 to Rx4, Ry1 to Ry4, Rz1 to Rz4), the IC region E2 having the integrated circuit described above, and a bonding region E3 hag the first meta layer 18 explained in the first embodiment. In a plan view, a layout of those regions (E1, E2, E3) is designed such that the sensor region E1 is positioned at a substantially center portion of the sensor substrate 1, the IC region E2 is formed around the sensor region E1, and the bonding region E3 is formed around the IC region E2. The frame portion 11 of the sensor substrate 1 of the present embodiment has a larger outside dimension than that of the first embodiment. In other words, since the sensor substrate 1 has an increased width dimension of the frame portion 11, the integrate circuit can be mounted on the frame portion 11.

The semiconductor wafer 10 is formed by use of an SOI wafer, as in the case of the first embodiment. The IC region E2 is preferably formed by using a multilayer wiring technique to achieve a reduction in occupied area of the IC region E2 on the sensor substrate 1. For example, in the IC region E2 of the sensor substrate 1, an insulating film 16 is formed by a laminated film of a silicon oxide film on the silicon layer 10c and a silicon nitride film on the silicon oxide film. On the insulating film 16, a multilayer structure portion 41 comprising an interlayer insulation film and a passivation film is formed. By appropriately removing a par of the passivation film, a plurality of pads 42 can be exposed. Each of the pads 42 is electrically connected to the second metal layer 19 on the insulating film 16 of the bonding region E3 through an outgoing wiring 43 made of a metal material such as Au. In the present embodiment, the outgoing wiring 43 and the second metal layer 19 are made of the same material, and integrally formed in a continuous manner. A part of the plural pads 42 formed on the IC region E2 is electrically connected to the sensing portion through the signal processing portion, and the other pads are electrically connected to the sensing portion not through the signal processing portion. In either case, through-hole wirings 24 of the first package substrate 2 are electrically connected to the gauge resistances of the sensing portion.

In the present embodiment, a concave portion 21 of the first package substrate 2 is formed to be larger than that of the first embodiment such that the sensor region E1 and the IC region E2 are accommodated in the concave portion. The multilayer structure portion 41 of the IC region E2 is disposed in the concave portion 21.

Referring to FIGS. 16A to 16D, a production method of the sensor substrate 1 of the present embodiment is explained below. Each of FIGS. 16A to 16D corresponds to a cross section taken along the line A-A in FIG. 15A.

First, diffusion layer wirings for the piezoresistive elements (Rx1 to Rx4, Ry1 to Ry4, Rz1 to Rz4) and the bridge circuits (Bx, By, Bz), and circuit elements of the integrated circuit described above are formed by using a CMOS process technique and so on. In a stage where a step of exposing the pads 42 of the IC region E2 has been finished, the multilayer structure portion 41 extends over the bonding region E3 as well as the sensor region E1. No metal wiring is formed on regions corresponding to the sensor region E1 and the bonding region E3 of the multilayer structure portion 41.

Figure 16A:
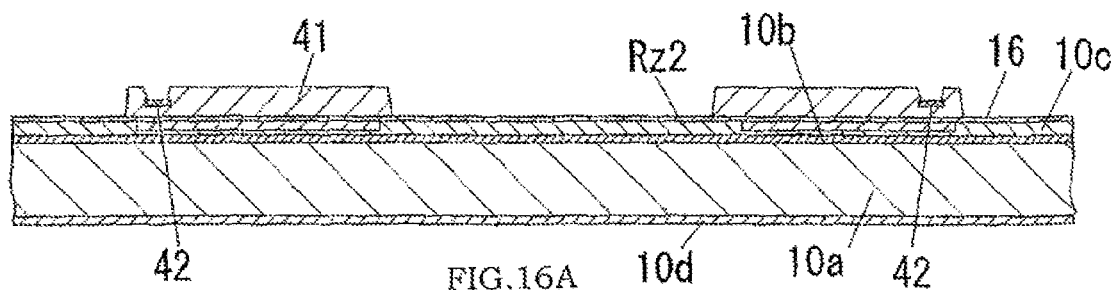
FIGS. 16A to 16D are schematic cross-sectional views showing a method of producing the sensor substrate of the second embodiment.

After finishing the step of exposing the pads 42, a patterned resist layer is formed such that the regions corresponding to the sensor region E1 and the bonding region E3 of the multilayer structure portion 41 are exposed. By using this resist layer as an etching mask, the exposed regions of the multilayer structure portion 41 are wet-etched and removed by using the silicon nitride film of the insulating film 16 on the silicon layer 10c as an etching stopper layer. Subsequently, by removing the resist layer, the structure shown in FIG. 16A is obtained.

Figure 16B:
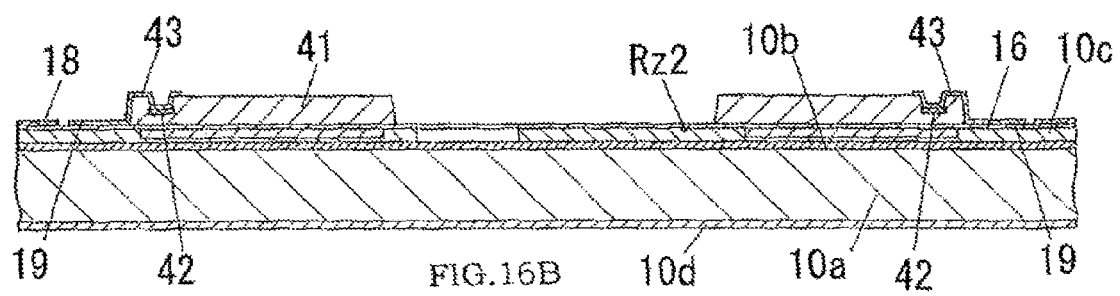

Next, the first metal layer 18, the second metal layers 19 and the outgoing wirings 43 are formed by using a thin-film forming method such as sputtering and conventional lithography and etching techniques. Then, a patterned resist layer is formed on the insulating film 16 at the gene surface side of the SOI wafer such that regions corresponding to the frame portion 11, the core section 12a of the weight portion 12 and the flexible portions 13 are covered by the resist layer, and the other regions are exposed. By using this resist layer as an etching mask, a surface patterning process is performed. That is, the exposed regions of the insulating film 16 are etched and removed to perform pattering of the insulating film 16. This etching step is further continued by using the insulating layer 10b as an etching stopper layer so as to have an etching depth reaching the insulating layer 10b from the general surface side of the SOI wafer. Subsequently, by removing this resist layer, a structure shown in FIG. 16B is obtained. As a result of this surface patterning process, the silicon layer 10c of the SOI wafer remains at the regions corresponding to the frame portion 11, the core section 12a and the flexible portions 13. As the etching step of this surface patterning process, for example, it is preferred to perform dry etching by use of an inductively-coupled plasma (ICP) type dry etching apparatus. The etching condition is set such that the insulating layer 10b functions as the etching stopper layer.

Figure 16C:
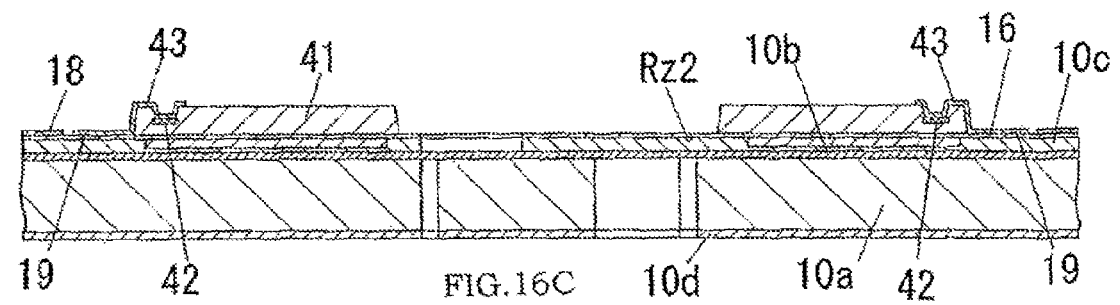

After the surface patterning process described above, a patterned resist layer is formed on a silicon oxide film 10d at the rear surface side of the support substrate 10a of the SOI wafer such that regions corresponding to the frame portion 11, the core section 12a and the weights 12b are covered by the resist layer and the other regions are exposed. By using this resist layer as the etching mask, a rear-surface patterning process is performed. That is, the exposed regions of the silicon oxide film 10d are etched and removed to perform patterning of the silicon oxide film 10d. After the resist layer is removed, dry etching is further performed in a substantially vertical direction by using the silicon oxide film 10d as the etching stopper layer so as to have an etching depth reaching the insulating layer 10b from the rear surface side of the SOI wafer. Thus, a structure shown in FIG. 16C is obtained. As a result of this surface patterning process, the support substrate 10a of the SOI war remains at the regions corresponding to the frame portion 11, the core section 12a and the weights 12b. As an etching apparatus for this rear-surface patterning process, for example, it is preferred to use an inductively-coupled plasma (ICP) type dry etching apparatus. The etching condition is set such that the insulating layer 10b functions as the etching stopper layer.

Figure 16D:
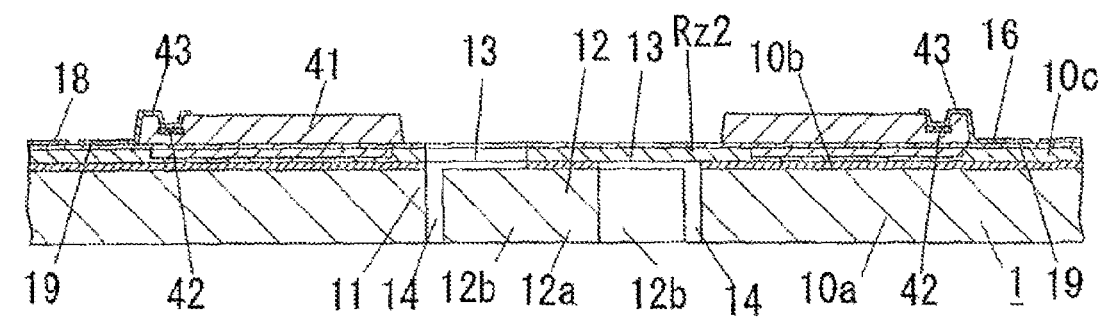

After the rear-surface patterning process, a separation process is performed to form the frame portion 11, the flexible portions 13 and the weight portion 12 by etching and removing undesired portions by means of wet etching, while leaving the regions corresponding to the frame portion 11 and the core section 12a of the insulating film 10b. As a result, a structure shown in FIG. 16D is obtained. In this separation process, the silicon oxide film 10d on the rear surface of the SOI wafer is also etched and removed.

Figure 17A:
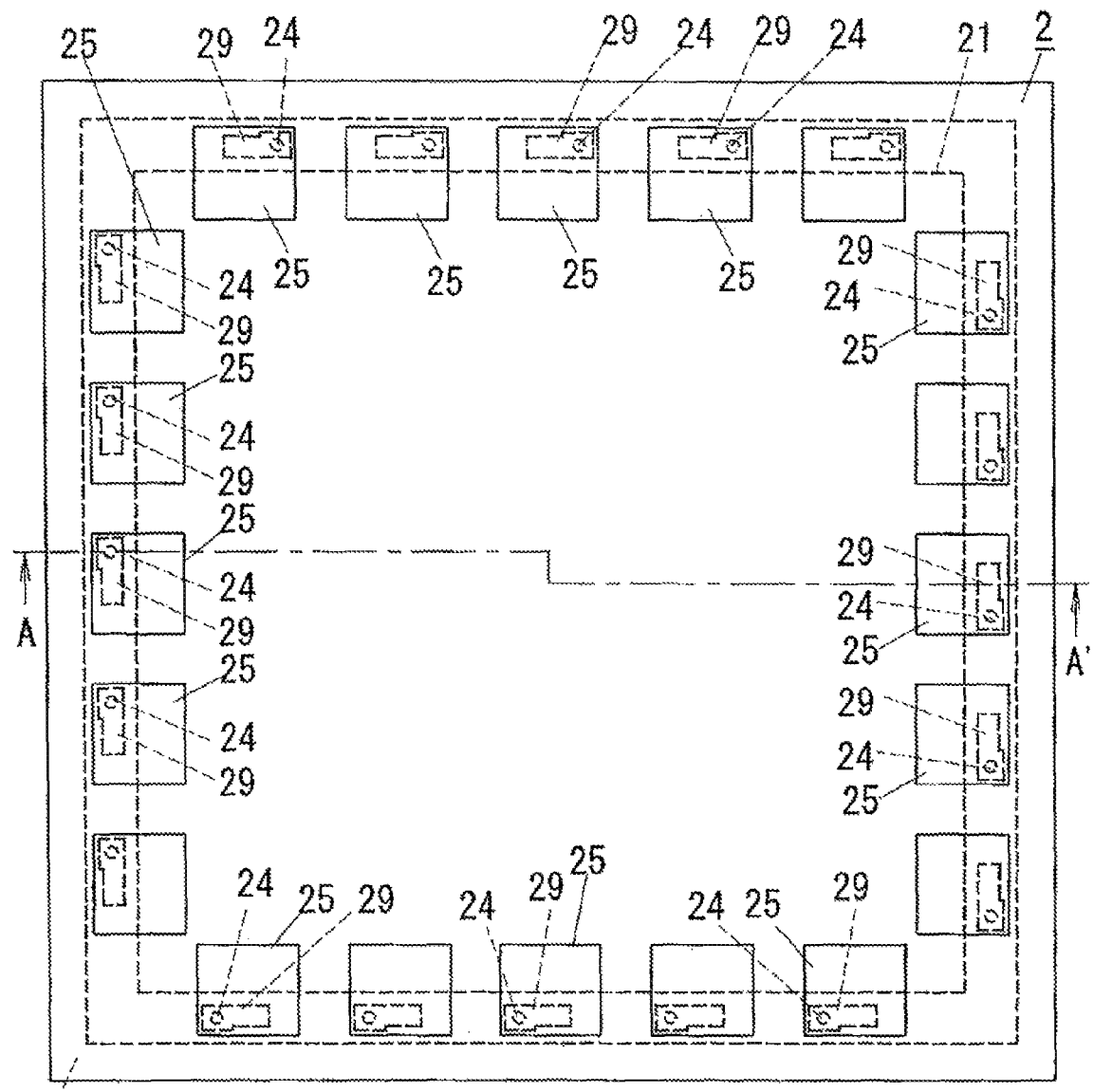
FIG. 17A is a top view of a first package substrate.
Figure 17B:
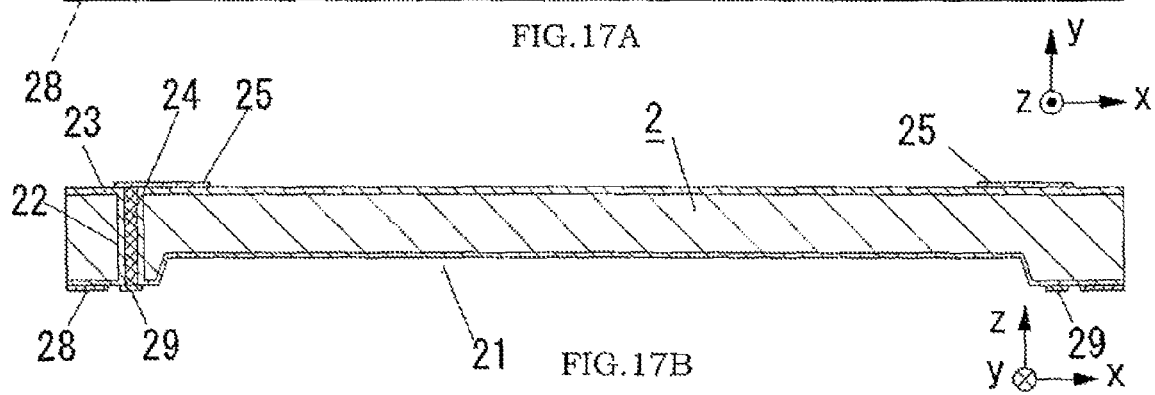
FIG. 17B is a cross-sectional view taken along the line A-A' in FIG. 17A.
Figure 18A:
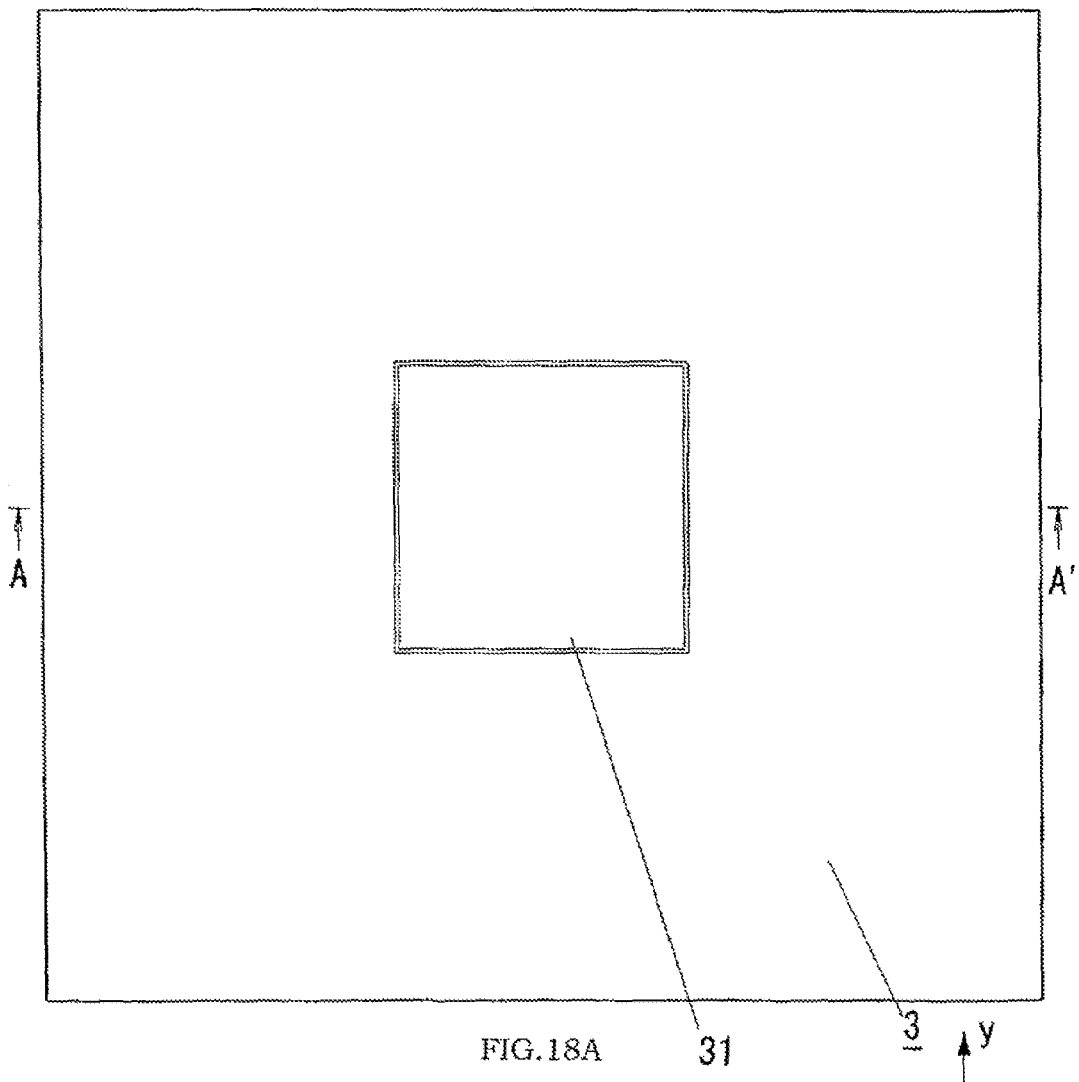
FIGS. 18A and 18B are respectively top and cross-sectional views of a second package substrate.
Figure 18B:
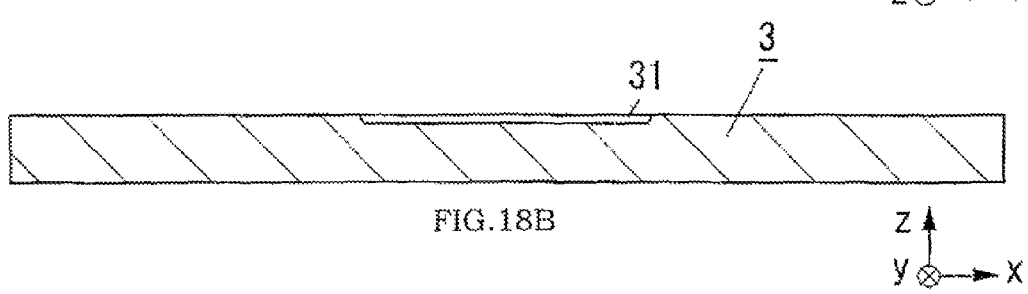

The wafer level package structure 100 of the present embodiment is obtained by bonding each of the first package substrate 2 show in FIGS. 17A and 17B and the second package substrate 3 shown in FIGS. 18A and 18B to the sensor substrate 1 at room temperature in a war level. That is, by room-temperature bonding between the activated surfaces (Au—Au surfaces) of the first metal layer 18 of the sensor substrate 1 and the metal layer 28 of the first package substrate 2 and room-temperature bonding between the activated surfaces (Au—Au solid-phase bonding) of the second metal layers 19 and the wiring layers 29 of the first package substrate 2, the sensor substrate 1 is integrated with the first package substrate 2. On the other hand, by room-temperature bonding between the activated surfaces (Si—Si solid-phase bonding) of the frame portion 11 of the sensor substrate 1 and the second package substrate 3, the sensor substrate 1 is integrated with the second package substrate 3.

The acceleration sensor device of the present embodiment can be obtained by a dicing process of cutting the thus obtained wafer level package structure 100 into a predetermined size (a desired chip size). The acceleration sensor device of FIG. 14C corresponds to a cross section of a region surrounded by the dotted circle "A" of the wafer level package structure 100 shown in FIG. 14A. Therefore, the first and second pack substrates (2, 3) have the same outside dimension as the sensor substrate 1. As a result, a compact chip size package can be realized, and the manufacturing process becomes easy.

In addition, since the IC chip including the integrated circuit operable in collaboration with the gauge resistances is built in the acceleration sensor device of the present embodiment, it is possible to achieve downsizing and cost reduction, as compared with conventional sensor modules. Furthermore, an improvement in sensor characteristics be achieved by shortening wiring lengths between the gauge resistances and the integrated circuit.

Third Embodiment

In each of the above embodiments, the piezoresistance type acceleration sensor was used as the sensor unit. The technical concept of the present invention is also available to the other sensor unit such as a capacitance type acceleration sensor or a gyro sensor. The present embodiment is characterized by forming a gyro sensor unit on a sensor substrate. The other configurations of the present embodiment are substantially the same as those of the first embodiment. Therefore, a bonding portion between the sensor substrate 101 and each of the first and second package substrates (102, 103) can be formed according to the same manner as the first embodiment.

A wafer level package structure of the present embodiment has a structure comprising a semiconductor wafer with a plurality of gyro sensor units, a first package wafer bonded to one of opposite surfaces of the semiconductor wafer, and a second package wafer bonded to the other surface of the semiconductor wafer. In the following explanation, a region for forming each of the gyro sensor units of the semiconductor wafer is defined as the sensor substrate 101. In addition, a region facing each of the sensor substrates 101 of the first package wafer is defined as the first package substrate 102. Similarly, a region facing each of the sensor substrates 101 of the second package wafer is defined as the second package substrate 103.

In the present embodiment, the sensor substrate 101 is formed by use of a silicon substrate having a resistivity of 0.2 $\Omega \cdot cm$. Each of the first and second pack substrates (102, 103) is formed by use of a silicon substrate having a resistivity of 20 $\Omega \cdot cm$. These resistivity values are illustrative only, and therefore the present invention is not limited to them.

Figure 19:
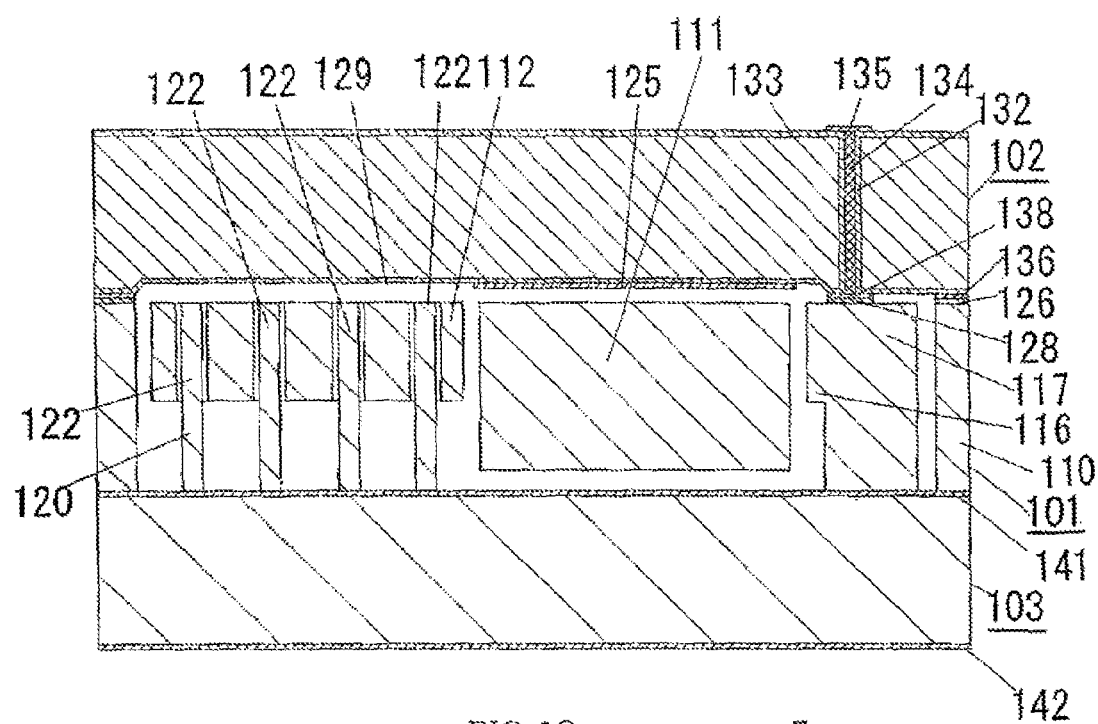
FIG. 19 is a schematic cross-sectional view of a gyro sensor device according to a third embodiment.

As shown in FIG. 19, the gyro sensor unit is mainly formed with a movable portion comprising a first mass body 111, which can be vibrated by vibrating means, and a second mass by 112 coupled to the first mass body 111, and a detecting portion configured to convert a positional displacement of the second mass body 112, which is caused a rotational force is applied during the vibration of the first mass body 111, into an electrical signal.

That is, the first mass body 111 and the second mass body 112, each of which has substantially a rectangular outer peripheral shape in plan view, are arranged in parallel along a surface of the sensor substrate 101. In addition, the sensor substrate 101 has a frame portion 110 (e.g., a rectangular frame portion in the present embodiment) extending around the first and second mass bodies (111, 112). In the present embodiment, an orthogonal coordinate system is defined, as shown at a lower right portion in each of FIGS. 19 to 23. That is, a direction of arranging the first and second mass bodies (111, 112) corresponds to the "y" axis direction, and a direction orthogonal to the "y" axis direction in a plane extending along the surface of the sensor substrate 101 corresponds to the "x" axis direction. In addition, a direction orthogonal to the "x" axis direction and the "y" axis direction (i.e., a thickness direction of the sensor substrate 101) corresponds to the "z" axis direction.

Figure 20:
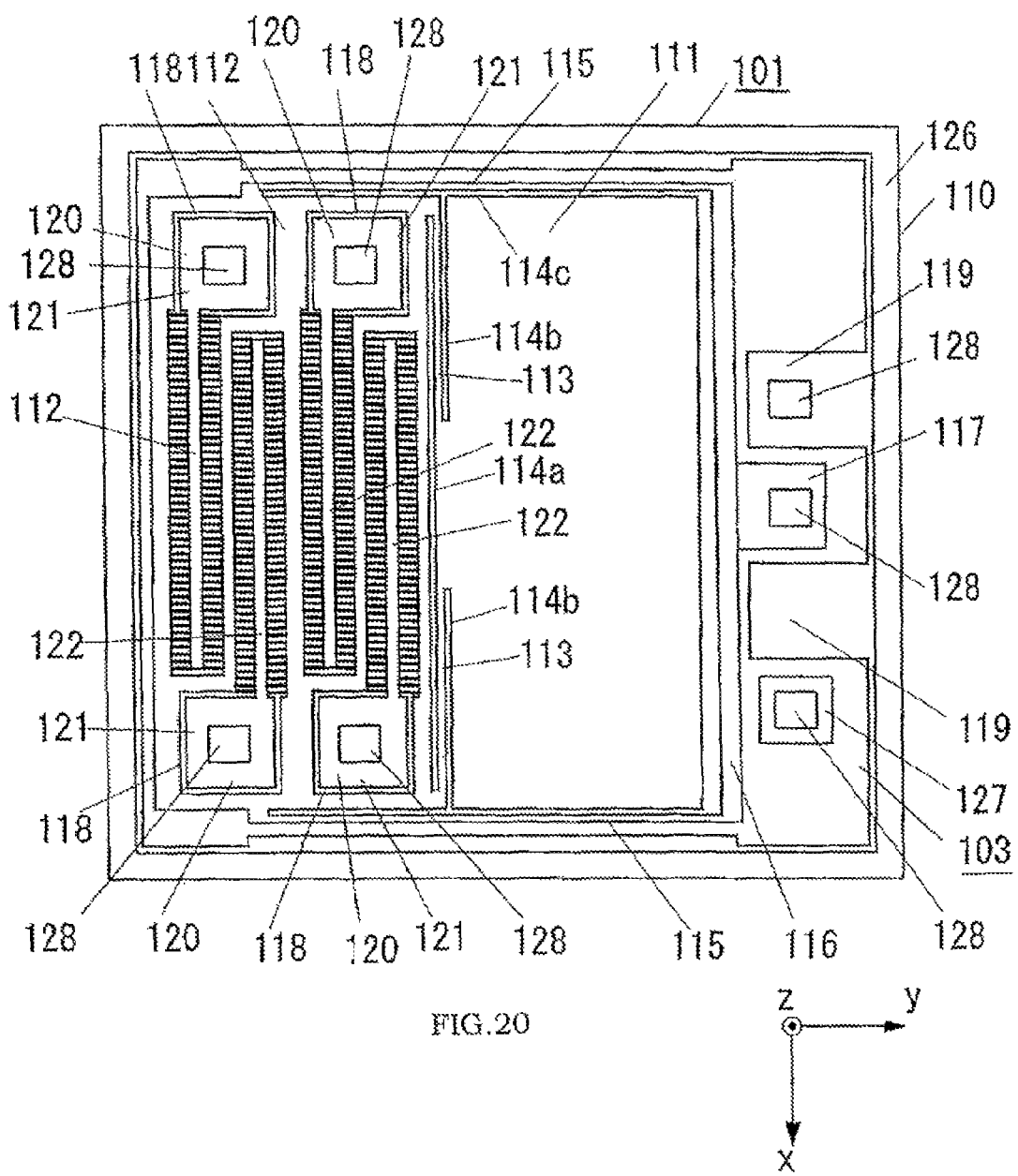
FIG. 20 is a schematic plan view of a sensor substrate according to the third embodiment.

As shown in FIG. 20, the first mass body 111 and the second mass body 112 of the sensor substrate 101 are integrally coupled to each other through a pair of drive springs 113 extending in the "x" axis direction. That is, the sensor substrate 101 has a slit groove 114a having a length slightly shorter than the entire length of the second mass body 112 in the "x" axis direction, and two slit grooves 114b arranged in a straight line along the "x" axis direction and at the lateral side of the first mass body 111. Each of the slit grooves 114b has an opening at its one end. Each of the drive springs 113 is formed between the slit groove 114a and ea of the slit grooves 114b. An end portion of each of the drive springs 113 continuously extends between an end portion of the slit groove 114a and a lateral edge of the second mass body 112, and the other end portion of the drive spring 113 continuously extends to the first mass body 111 through a region between the slit grooves 114b. The drive spring 113 is a torsion spring having a torsions deformation capability, and enable a positional displacement of the first mass body 111 relative to the second mass body 112 about the drive spring 113. That is, the drive springs 113 enables a translational movement in the "z" axis direction of the first mass body 111 relative to the second mass body 112 as well as a rotational movement about the "x" axis of the first mass body 111 relative to the second mass body 112. In addition, since the sensor substrate 101 uses the torsion spring as the drive spring 113, it is not necessary to reduce a dimension of the drive spring 113 in the thickness direction of the sensor substrate 101. Therefore, the drive springs 113 can be easily manufactured.

The numeral 115 designates a detection spring extending in the "y" axis direction, and continuously connected at its one end to an edge portion in the "x" axis direction of the second mass body 112 of the sensor substrate 101. The opposite end portion of one of the detection springs 115 is continuously connected to that of the other detection spring 115 through a coupling member 116 extending in the "x" axis direction. That is, a substantially "C" shaped member is formed in plan view by the pair of the detection springs 115 and the coupling member 116. In this regard, the coupling member 116 is designed to have a sufficiently higher rigidity than the drive springs 113 and the detection springs 115. The numeral 117 designates a fixation portion projecting from an intermediate portion in the longitudinal direction of the coupling member 116. The fixation portion 117 is fixed to a predetermined position of the second package substrate 103. The first and second mass bodies (111, 112) are separated from the detection springs 115 and the coupling member 116 by a slit groove 114c formed in a substantially "C" shape. The one end of the slit groove 114b is communicated with the slit groove 114c. Each of the detection springs 115 has a bending deformability in the "x" axis direction. Therefore, the detection springs 115 enable a positional displacement of the first and second mass bodies (111, 112) relative to the fixation portion 117 in the "x" aids direction.

By the way, the sensor substrate 101 has four apertures 118 penetrating the second mass body 112 in the thickness direction, and a stationary part 120 disposed in each of the apertures 118. The stationary part 120 has an electrode portion 121 disposed in the vicinity of each end in the "x" axis direction of the second mass body 112, and a comb bone portion 122 extending from the electrode portion 121 in the "x" axis direction. The electrode portion 121 and the comb bone portion 122 are configured in a substantially "L" shape. The electrode portion 121 and the comb bone portion 122 are bonded to the second package substrate 103. That is, the stationary part 120 is fixed at a predetermined position. An inner surface of the aperture 118 extends along an outer peripheral surface of the stationary part 120 through a clearance. A pair of the electrode portions 121 is disposed at both ends in the "x" axis direction of the second mass body 112. As shown in FIG. 21, a plurality of stationary comb teeth 123 arranged along the "x" axis direction are formed at both sides in the width direction of the comb bone portion 122. On the other hand, a plurality of movable comb teeth 124 are formed in the aperture 118 at a side facing the comb bone portion 122 of the second mass body 112, and arranged along the "x" axis direction such that each of the movable comb teeth 124 is in a face-to-face relation with each of the stationary comb teeth 123, as shown in FIG. 21. Each of the movable comb teeth 124 is located away from a corresponding stationary comb tooth 123 by a distance. When the second mass body 112 is displaced in the "x" axis direction, a change in distance between the stationary comb teeth 123 and the movable comb teeth 124 occurs, so that a change in electric capacitance caused by the change in distance is detected. That is, a detection means for detecting the positional displacement of the second mass body 112 is composed of the stationary comb teeth 123 and the movable comb teeth 124.

The sensor substrate 101 is coupled to the second package substrate 103 by bonding the frame portion 110, the fixation portion 117, and the stationary parts 120 to the second package substrate 103. In other words, the second pack substrate 103 is used as a support substrate for supporting the sensor substrate 101. On the other hand, since the first and second mass bodies (111, 112) are formed to be displaceable in the "z" axis direction, the bottom surfaces facing the second package substrate 103 of the first and second mass bodies (111, 112) baked away from the second package substrate 103, as shown in FIG. 19. That is, the thickness of each of the first and second mass bodies (111, 112) in the thickness direction of the sensor substrate 101 is determined to be smaller than the thickness of the frame portion 110. Thus, a clearance is ensured between the second package substrate 103 and each of the first and second mass bodies (111, 112). In the present embodiment, a gap length between the first mass body 111 and the second package substrate 103 is set to 10 µm. This value is illustrative only, and therefore the present invention is not limited to it.

In addition, the sensor substrate 101 has a pair of ground portions 119 formed on the frame portion 110 at the vicinity of the fixation portion 117 such that the fixation portion 117 is located between the ground portions 119. The numeral 127 designates an electrode portion electrically connected to an electrode 125 described later, and formed near one of the ground portions 119. The ground portions 119 and the electrode portion 127 are bonded to the second package substrate 103. At the upper-surface side, a second metal layer 128 is formed on the fixation portion 117, the electrode portions 121, one of the ground portions 119 and the electrode portion 127. In this regard, one fixation portion 117, four electrode portions 121, one ground portion 119 and one electrode portion 127 are separately arranged from each other at the upper-surface side of the second package substrate 103. In a state where the first package substrate 102 is not bonded to the frame portion 110, they are electrically insulted from each other. In addition, at the upper-surface side of the sensor substrate 101, the frame portion 110 has a first metal layer 126 formed over the entire circumference thereof. Each of the first and second metal layers (126, 128) is formed by a laminated film of a Ti film and an Au film. In brief, since te first and second metal layers (126, 128) are made of the same metal material, it is possible to simultaneously obtain these metal layers with the same thickness. In each of the first and second metal layers (126, 128), the Ti film preferably has a thickness of 15 to 50 nm, and the Au film preferably has a thickness of 500 nm. These thickness values are illustrative only, and therefore the present invention is not limited to them. As a material for forming the Au film, an Au material containing an impurity may be used in place of pure gold.

Figure 22:
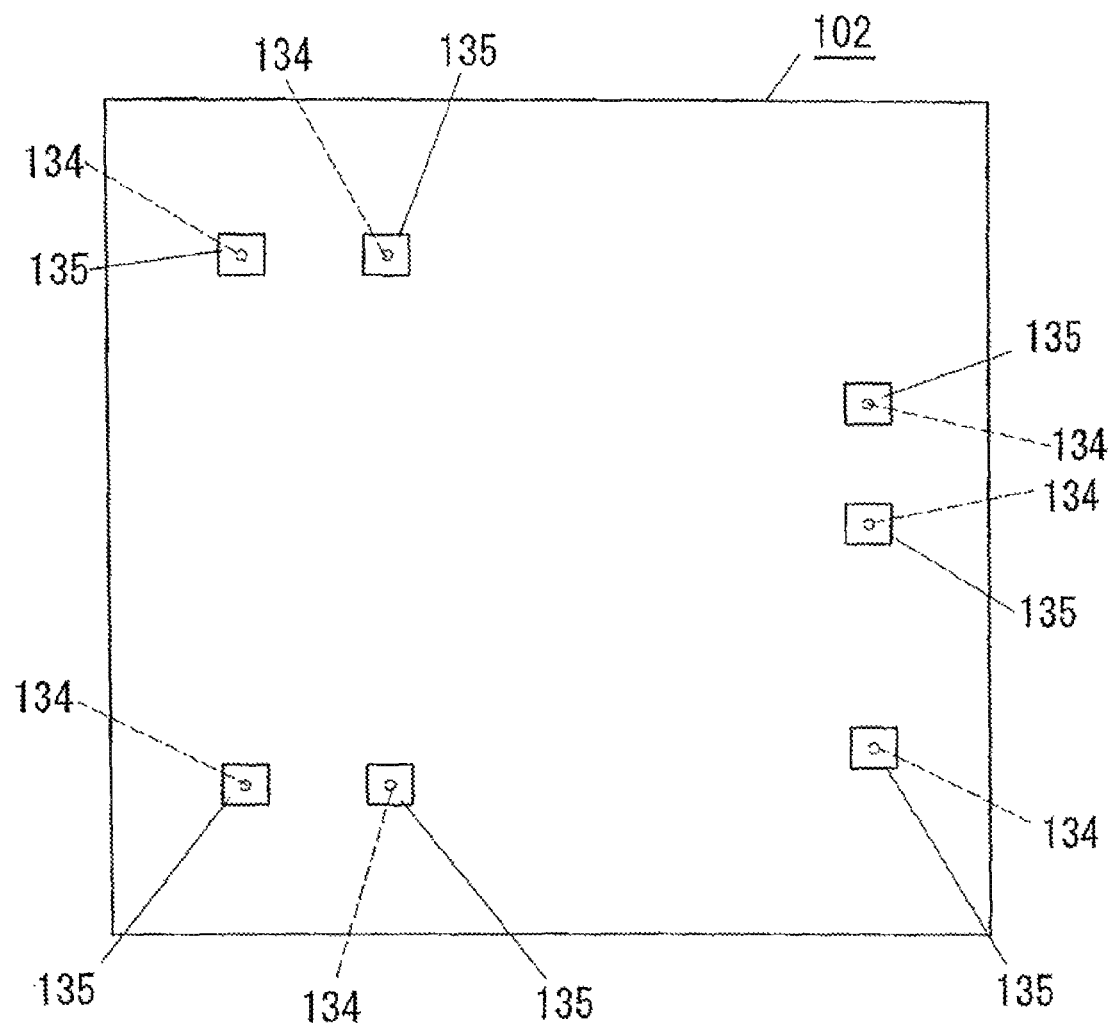
FIG. 22 is a schematic plan view of a first package substrate according to the third embodiment.
Figure 23:
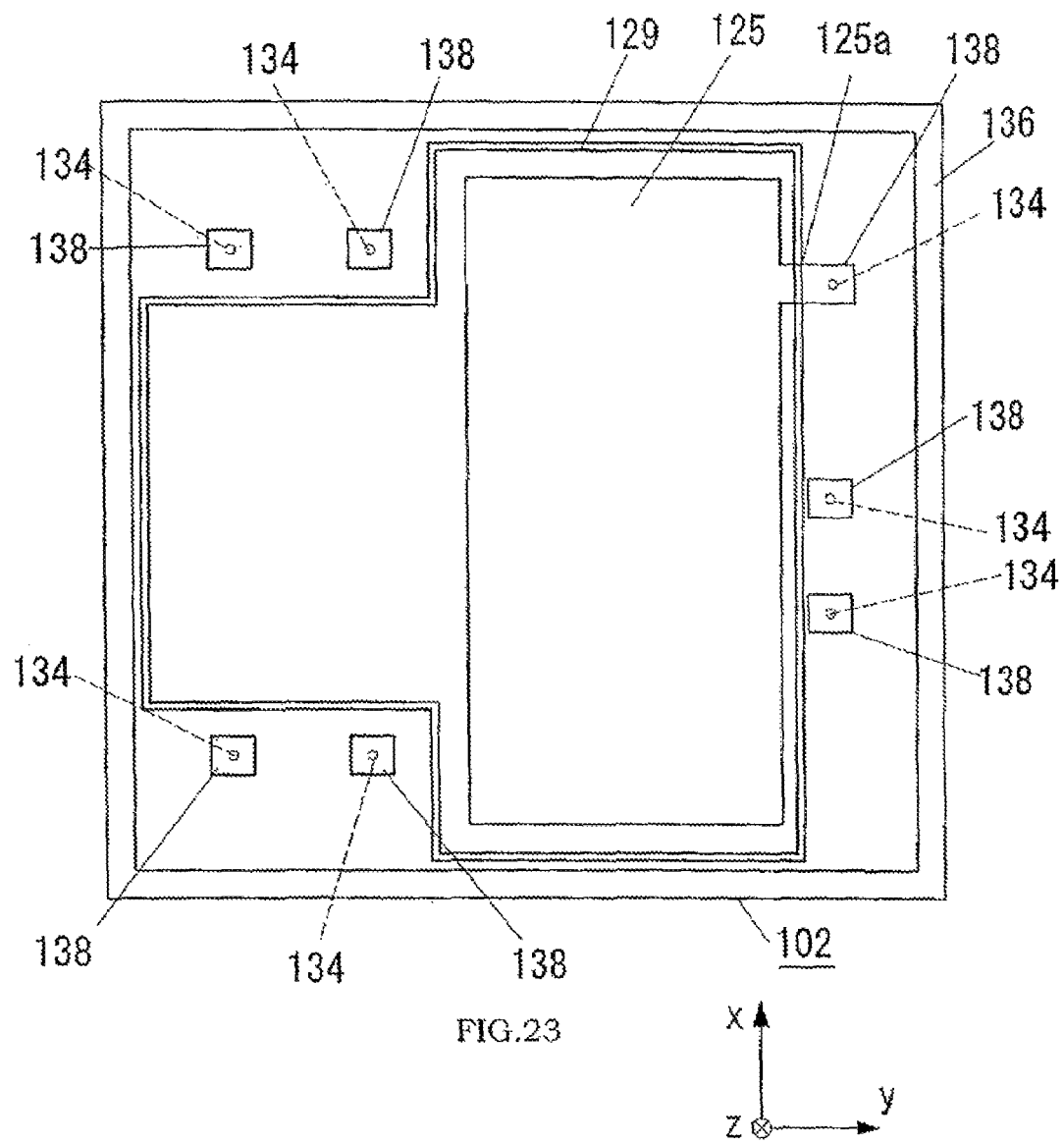
FIG. 23 is a schematic bottom view of the first package substrate.
Figure 24A:
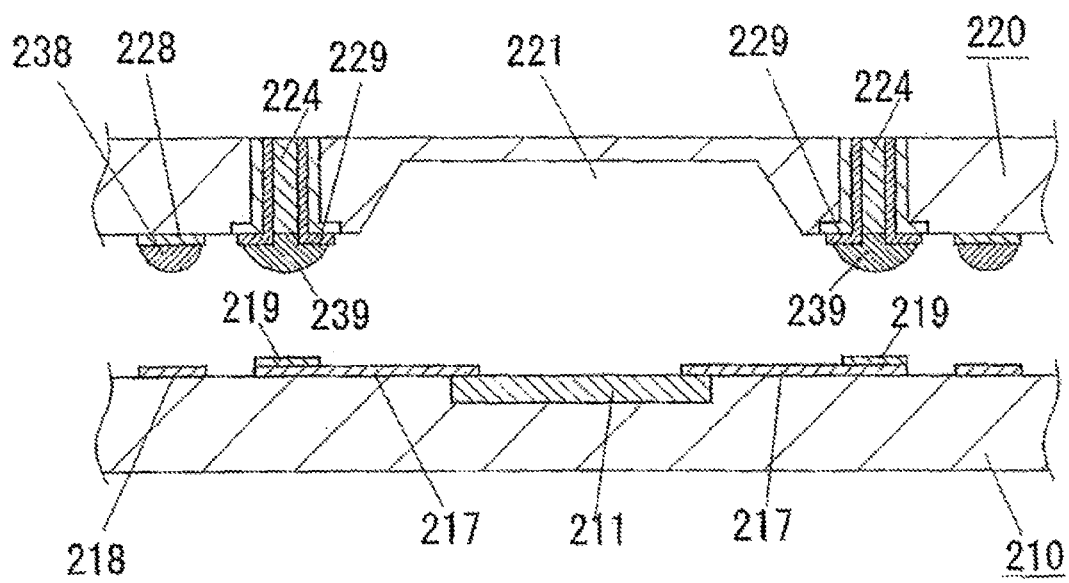
FIGS. 24A and 24B are explanatory views of a method of manufacturing a conventional wafer level package structure.
Figure 24B:
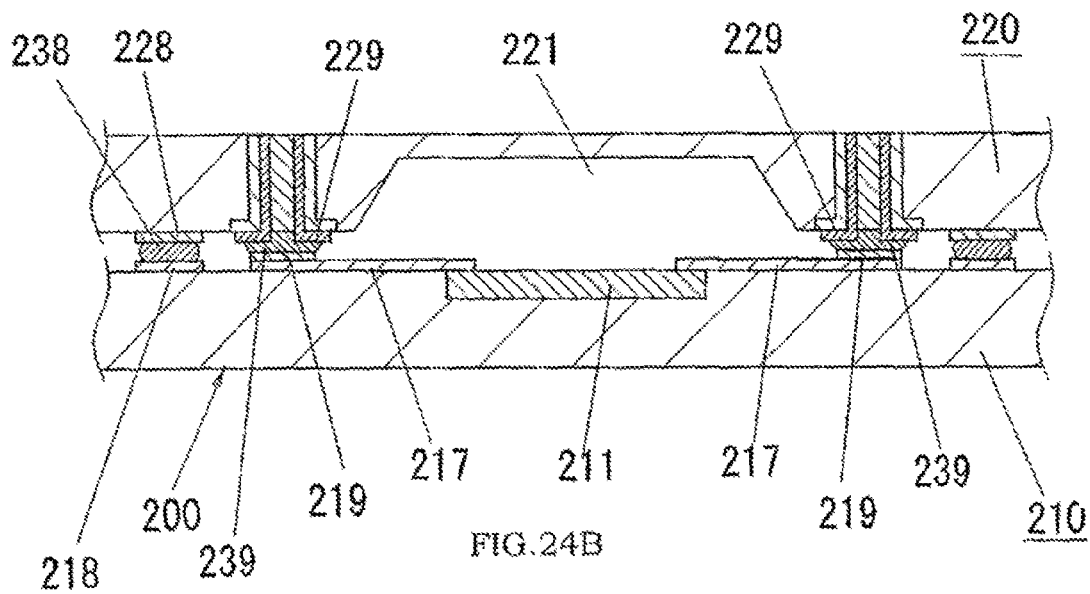

As shown in FIGS. 22 and 23, the first package substrate 102 has a concave portion 129 configured to provide a space for positional displacements of the first and second mass bodies (111, 112) at the side facing the sensor substrate 101, i.e., in the bottom surface of the first package substrate 102 shown in FIG. 19. In addition, the first package substrate 102 has a plurality of through holes 132 penetrating in the thickness direction. A heat insulating film 133 (a silicon oxide film) is formed on both opposite surfaces in the thickness direction of the first package substrate 102 and inner surfaces of the through holes 132. Therefore, the heat insulating film 133 lies between a through-hole wiring 134 and the inner surface of the through hole 132. In the present embodiment, copper is used as a material for the through-hole wiring 134. Alternatively, nickel or the like may be used in place of copper.

The first package substrate 102 has the above-described electrode 125 (FIGS. 19 and 23) formed at a region facing the first mass body 111 on the bottom surface of the concave port 129 through the insulating film 133. The electrode 125 is formed by a laminated of a Ti film and an Au film. In the present embodiment, a gap length between the first mass body 111 and the electrode 125 is set to 10 µm. This value is illustrative only, and therefore the present invention is not limited to it.

In addition, the first package substrate 102 has a plural of metal layers 138 formed on the surface facing the sensor substrate 101, and electrically connected to the through-hole wing 134. In addition, the first package substrate 102 has a (rectangular) frame-like metal layer 136 formed over the entire circumference thereof on the surface facing the sensor substrate 101. In this regard, the metal layers 138 are bonded to the second metal layers 128 of the sensor substrate 101 to make electrical connections therebetween. The metal layer 136 is bonded to the first metal layer 126 of the sensor substrate 101. Each of the metal layer 136 and the metal layers 138 is formed by a laminated film of a Ti film and an Au film on the Ti film. In brief, since the metal layer 136 and the metal layers 138 are made of the same metal material, it is possible to simultaneously obtain these metal layers with the same thickness. In each of the metal layer 136 and the metal layers 138, the Ti film preferably has a thickness of 15 to 50 nm, and the Au film preferably has a thickness of 500 nm. These thickness values are illustrative only, and therefore the present invention is not limited to them, As a material for forming the Au film, an Au material containing an impurity may be used in place of pure gold. In addition, in the present embodiment, the Ti film is formed as an adhesive layer for improving the adhesion between the Au film and the insulating film 133. In place of the Ti, Cr, Nb, Zr, TiN, TaN or the like may be used as the material for the adhesive layer.

The first package substrate 102 has a plurality of electrodes 135 for external connection formed on an opposite surface of the surface facing the sensor substrate 101. These electrodes 135 are electrically connected to the through-hole wirings 134. Each of the electrodes 135 is configured in a rectangular outer peripheral shape, and formed by a laminated film of a Ti film and an Au film.

On the other hand, the second package substrate 103 has heat insulating films (141, 142) such as a silicon oxide film formed on both opposite surfaces in the thickness direction thereof.

As described in the first embodiment, the sensor substrate 101 is bonded to the first package substrate 102 by solid-phase direct bonding between the first metal layer 126 and the metal layer 136. That is, the first package substrate 102 is sealingly bonded to the ire circumference of the fame portion 110 of the sensor substrate 101. In addition, the second metal layer 128 is electrical connected to the metal layer 138 by solid phase direct bonding. An interior of the gyro sensor unit is airtightly sealed from the outside by these solid-phase direct bondings. In addition, the second metal layer 128 of the sensor substrate 101 is electrically connected to the electrode 135 through the metal layer 138 and the through-hole wiring 134. The second package substrate 102 has a wiring portion 125a (FIG. 23) extending from the electrode 125 to a peripheral portion of the concave portion 129, which is continuously formed with the metal layer 138 bonded to the second metal layer 128 on the electrode portion 127 of the sensor substrate 101.

To form the bonding portion between the sensor substrate 101 and each of the first and second package substrates (102, 103), a room-temperature bonding method for forming the direct bonding at low temperature is used to reduce residual stress in the sensor substrate 101. In the room-temperature bonding method, the surfaces to be bonded are cleaned up and activated by irradiating an ion beam, an atomic beam or plasma of argon in vacuum, and then the activated surfaces are directly bonded to each other at room temperature in vacuum. In the present embodiment, according to the room-temperature bonding method described above, the direct bonding between the first metal layer 126 and the metal layer 136 and the direct bonding between the second metal layer 128 and the metal layer 138 are simultaneously obtained by applying an appropriate load to the bonding interface at room temperature in vacuum. In addition, the frame portion 110 of the sensor substrate 101 is directly bonded in an airtight manner to the peripheral portion of the second pack substrate 103 at room temperature in vacuum by the room-temperature bonding method.

The room-temperature boding method of the present embodiment is explained below. Duplicate explanations about the same steps as the first embodiment are omitted.

After micromachining is appropriately performed to the sensor substrate 101, and the sensor substrate 102 is bonded to the second package substrate 103 at room temperature, an etching step for separating a portion used as the movable portion of the sensor substrate 101 from the other portion and a metal layer formation step for forming the first and second metal layers (126, 128) are performed. In the present embodiment, the sensor substrate 101 is bonded to the second page substrate 103 by the room-temperature bonding between Si and $SiO_2$. Subsequently, the sensor substrate 101 integrated with the second package substrate 103 and the first package substrate 102 are placed in the chamber, and the chamber is vacuum exhausted to a predetermined degree of vacuum (e.g., $1\times10^{-5}$ Pa). Then, a surface activation treatment is performed. That is, the surfaces to be bonded to each other of the sensor substrate 101 and the first package substrate 102 are cleaned up and activated by means of sputter etching in vacuum. The degree of vacuum in the chamber during the surface activation treatment is approximately $1\times10^{-2}$ Pa, which is a lower degree of vacuum, as compared with the predetermined degree of vacuum in the chamber before the surface activation treatment.

After the surface activation treatment, an atmosphere adjusting step is performed to adjust the interior atmosphere of the chamber, in which the sensor substrate 101 and the second package substrate 103 are placed, to a designed atmosphere determined according to gyro sensor characteristics. In this regard, the gyro sensor of the present embodiment is designed in a predetermined degree of vacuum (a high vacuum of $1\times10^{-4}$ Pa or less), in order to increase a mechanical Q value (mechanical quality coefficient Qm) indicative of a mechanical vibration level in the of the resonance frequency, and achieve an improvement in sensitivity. In the atmosphere adjustment step of the present embodiment, after the surface activation treatment is finished, the interior atmosphere of the chamber is adjusted to the designed atmosphere by performing vacuum pumping until the degree of vacuum in the chamber reaches a predetermined degree of vacuum.

After the atmosphere adjusting step is finished, the sensor substrate 101 is bonded to the first package substrate 102 at room temperature under the atmosphere controlled in the atmosphere adjusting step. At the step of bonding between the sensor substrate 101 and the first package substrate 102, the room-temperature bonding between the first metal layer 126 and the metal layer 136, and the room-temperature bonding between the second metal layer 128 and the metal layer 138 are simultaneously obtained by applying an appropriate load (e.g., 300 N). In the present embodiment, the bonding between the sensor substrate 101 and the first package substrate 102 is provided by the room-temperature bonding between Au and Au.

It is preferred that the surface activation treatment, the atmosphere adjusting step and the bonding step are sequentially performed in the same chamber. The surfaces to be bonded to each other of the sensor substrate 101 and the first package substrate 102 are cleaned up and activated by the surface activation treatment. Then, those activated surfaces are bonded to each other, without exposure to the outside air, at room temperature in an airtight manner under a designed atmosphere determined according to desired sensor characteristics. Thereby, good bonding strength can be obtained therebetween. In the atmosphere adjusting step, since the chamber is vacuum exhausted to a predetermined degree of vacuum after the surface activation treatment to adjust the interior atmosphere to the designed atmosphere, it is possible to obtain a high mechanical Q value (mechanical quality coefficient Qm) indicative of a mechanical vibration level in the vicinity of the resonance frequency of the gyro sensor as the sensor element, and therefore achieve an improvement in sensitivity.

As described above, the wafer level package structure of the present embodiment has the direct bonding between the sensor substrate 101 and the first package substrate 102, and the direct bonding between the sensor substrate 101 and the second package substrate 103, which are formed according to the low-temperature process such as the room-temperature bonding method. Therefore, it is possible to prevent the influence of thermal stress, as compared with the case of bonding the sensor substrate 101 with each of the first and second substrates (102, 103) by a heat treat such as reflow soldering. As a result, there is an advantage that variations in sensor characteristics can be reduced. In addition, since the sensor substrate 101 is bonded to the second package substrate 103 through the insulating film 141, it is possible to prevent a reduction in resistance to electric noise. Furthermore, since the substrates are made of silicon wafers, and the insulating film 141 is formed by a silicon oxide film, the sensor substrate 101 can be easily bonded to each of the package substrates (102, 103) at room temperature, and variations in sensor characteristics can be reduced.

In the present embodiment, the second package substrate 103 is bonded to the sensor substrate 101 through the insulating film 141 formed on the surface facing the sensor substrate 101 of the second package substrate 103. In brief, they are preferably bonded to each other through an insulating film formed on at least one of the surface facing the sensor substrate 101 of the second package substrate 103 and the surface facing the second package substrate 103 of the sensor substrate 101.

In addition, by cutting (dicing) the wafer level package structure having the gyro sensor units integrally formed therewith into a size of the gyro sensor unit, it is possible to easily and efficiently obtain compact gyro sensor devices. Therefore, it is suitable for mass production.

An operation of the thus obtained gyro sensor is briefly explained below.

The gyro sensor of the present embodiment detects a positional displacement of the second mass body 112 when an angular velocity is applied to the gyro sensor by an eternal force under the condition that a predetermined vibration is given to the first mass body 111. In this regard, a vibrating voltage having a sine waveform or a rectangular waveform is applied between the electrode 125 and the first mass body 111 to vibrate the first mass body 111. For example, an AC voltage is used as the vibrating voltage, but polarity inversion is not essential. The first mass body 111 is electrically connected to the fixation portion 117 through the drive springs 113, the second mass body 112, the detection springs 115 and the coupling member 116. The second metal layer 128 is formed on this fixation portion 117. In addition, the electrode 125 is electrically connected to the second metal layer 128 on the electrode portion 127. Therefore, when the vibrating voltage is applied between the second metal layers 128 on the fixation portion 117 and the electrode portion 127, the first mass body 111 can vibrate in the "z" axis direction due to an electrostatic force between the first mass body 111 and the electrode 125. When the frequency of the vibrating voltage is equal to a resonance frequency determined according to weights of the first and second mass bodies (111, 112), and spring constants of the drive spring 113 and the detection spring 115, a large amplitude can be obtained by a relatively small driving force.

In a state where the first mass body 111 is being vibrated, when an angular velocity is applied to the gyro sensor about the "y" axis, a Coriolis force occurs in the "x" axis direction, so that the second mass body 112 (with the first mass body 111) is displaced in the "x" axis direction relative to the stationary part 120. When the movable comb teeth 124 are displaced relative to the stationary comb teeth 123, a change in distance between the movable comb teeth 124 and the stationary comb teeth 123 occurs, so that the electric capacitance therebetween changes. This change in electric capacitance can be taken out from the second metal layers 128 connected to the four stationary parts 120. Thus, it can be regarded that the above-described gyro sensor is provided with four variable capacitance capacitors. Therefore, the positional displacement of the second mass body 112 can be detected by measuring the electric capacitance of each of the variable capacitance capacitors, or the total capacitance of the variable capacitance capacitors connected parallel. Since the vibration of the first mass body 111 is previously determined, the Coriolis force can be calculated by detecting the positional displacement of the second mass body 112. In the present embodiment, the movable portion disposed inside of the frame portion 110 is composed of the first mass body 111, the drive springs 113, the second mass body 112, the detection springs 115 and the coupling member 116, and the sensing portion is composed of the stationary comb teeth 123 and the movable comb teeth 124 formed on the second mass body 112. In brief, a part of the sensing portion is formed in the movable portion disposed inside of the frame portion 110.

In this regard, the displacement of the movable comb teeth 124 is proportional to (the weight of the first mass body 111)/(the weight of the first mass body 111+the weight of the second mass body 112). Therefore, as the weight of the first mass body 111 becomes larger than the weight of the second mass body 112, the displacement of the movable comb teeth 124 increases. As a result, an improvement in sensitivity is achieved. In the present embodiment, from this reason, the thickness dimension of the first mass body 111 is determined to be larger than the thickness dimension of the second mass body 112.

INDUSTRIAL APPLICABILITY

As described above, according to the present invention, the semiconductor wafer with a plurality of compact sensor units is bonded to the package wafer by the solid-phase direct bonding without diffusion between the surface-activated regions formed thereon. Therefore, it is possible to obtain the wafer level package structure having substantially no residual stress at the bonding interface. In addition, since the interior of the sensor unit can be airtightly sealed from the outside air by the solid-phase direct bonding, it can be maintained in a desired atmosphere according to the kind of sensor such as an acceleration sensor and a gyro sensor.

In addition to an improvement in sensor characteristics, the wafer level package structure is easy to carry. By cutting the wafer level package structure into a size of the sensor unit, a compact sensor device having small variations in sensor characteristics can be obtained at a desired place. Therefore, there is an advantage of preventing compact sensor devices from failure or loss at the time of delivery. Thus, the wafer level package structure of the present invention is expected to be widely used in applications requiring a further reduction in size of the sensor device.

The invention claimed is:

1. A wafer level package structure comprising:
a semiconductor wafer having a plurality of sensor units, each of which comprises a frame having an opening, a movable portion held in said opening to be movable relative to said frame, and a detecting portion configured to output an electric signal according to a positional displacement of said movable portion;
a first package wafer bonded to one of opposite surfaces of said semiconductor wafer; and
a second package wafer bonded to the other surface of said semiconductor wafer;
wherein said frame of each of said sensor units has a first surface-activated region formed on a surface facing the first package wafer over an entire circumference thereof so as to surround said movable portion, and a second surface-activated region formed on a surface facing the second package wafer over an entire circumference thereof so as to surround said movable portion, the bonding between said semiconductor wafer and the first package wafer is a solid-phase direct bonding without diffusion between said first surface-activated region and a surface-activated region formed on the first package wafer, and the bonding between said semiconductor wafer and the second package wafer is a solid-phase direct bonding without diffusion between said second surface-activated region and a surface-activated region formed on the second package wafer, wherein at least one of said first surface-activated region and said second surface-activated region comprises a ring-like outer surface-activated region formed over the entire circumference of said frame so as to surround said movable portion, and a ring-like inner surface-activated region formed at an inner side of said outer surface-activated region over the entire circumference of said frame so as to surround said movable portion, and wherein said wafer level package structure further comprises an auxiliary sealing portion for connecting between said outer surface-activated region and said inner surface-activated region, and wherein said auxiliary sealing portion is formed at plural locations spaced from each other by a predetermined distance in the circumferential direction of said frame.

2. The wafer level package structure as set forth in claim 1, wherein said first surface-activated region, said second surface-activated region, the surface-activated region of the first package wafer, and the surface-activated region of the second package wafer are any one of a plasma-treated surface, an ion-beam irradiated surface, and an atomic-beam irradiated surface.

3. The wafer level package structure as set forth in claim 1, wherein at least one of the bonding between said first surface-activated region and the surface-activated region on the first package wafer and the bonding between said second surface-activated region and the surface-activated region on the second package wafer is any one of the solid-phase direct bonding between Si and Si, the solid-phase direct bonding between Si and $SiO_2$, and the solid-phase direct bonding between $SiO_2$ and $SiO_2$.

4. The wafer level package structure as set forth in claim 1, wherein at least one of the bonding between said first surface-activated region and the surface-activated region on the first package wafer and the bonding between said second surface-activated region and the surface-activated region on the second package wafer is any one of the solid-phase direct bonding between Au and Au, the solid-phase direct bonding between Cu and Cu, and the solid-phase direct bonding between Al and Al.

5. The wafer level package structure as set forth in claim 1, wherein each of said sensor units has an integrated circuit operable in collaboration with said detecting portion, and said integrated circuit is disposed adjacent to said opening of said frame, and electrically connected to a through-hole wiring formed in the first package wafer.

6. The wafer level package structure as set forth in claim 5, wherein said integrated circuit is disposed so as to surround said opening of said frame.

7. The wafer level package structure as set forth in claim 5, wherein said through-hole wiring is formed in a tapered shape in the first package wafer such that an end portion facing said sensor unit has a larger area than the other end portion.

8. The wafer level package structure as set forth in claim 1, wherein each of said sensor units is an acceleration sensor unit, said movable portion comprises a weight and a beam portion extending between said frame and said weight, and said detecting portion comprises at least one piezoresistive element provided on said beam portion.

9. The wafer level package structure as set forth in claim 1, wherein each of said sensor units is a gyro sensor unit, said movable portion comprises a first mass body vibrated by a vibrating means, and a second mass body coupled to the first mass body, and said detecting portion is configured to convert a positional displacement of the second mass body caused when a rotational force is added during the vibration of the first mass body into an electrical signal.

10. The wafer level package structure as set forth in claim 1, wherein each of said sensor units has a conductive layer formed at a position closer to said movable portion than said first surface-activated region, and electrically connected to said detecting portion, the first package wafer has a through-hole wiring, and a wiring layer electrically connected to said through-hole wiring with respect to each of said sensor units, and the bonding between the first package wafer and said semiconductor wafer further comprises a solid-phase direct bonding without diffusion between an activated surface of said conductive layer and an activated surface of said wiring layer.

11. A sensor device obtained by cutting the wafer level package structure as set forth in claim 1 into a size of said sensor unit.

12. A wafer level package structure comprising:

a semiconductor wafer having a plurality of sensor units, each of which comprises a frame having an opening, a movable portion held in said opening to be movable relative to said frame, and a detecting portion configured to output an electric signal according to a positional displacement of said movable portion;

a first package wafer bonded to one of opposite surfaces of said semiconductor wafer; and a second package wafer bonded to the other surface of said semiconductor wafer;

wherein said frame of each of said sensor units has a first surface-activated region formed on a surface facing the first package wafer over an entire circumference thereof so as to surround said movable portion, and a second surface-activated region formed on a surface facing the second package wafer over an entire circumference thereof so as to surround said movable portion, the bonding between said semiconductor wafer and the first package wafer is a solid-phase direct bonding without diffusion between said first surface-activated region and a surface-activated region formed on the first package wafer, and the bonding between said semiconductor wafer and the second package wafer is a solid-phase direct bonding without diffusion between said second surface-activated region and a surface-activated region formed on the second package wafer, and wherein each of said sensor units has an integrated circuit operable in collaboration with said detecting portion, and said integrated circuit is disposed adjacent to said opening of said frame, and electrically connected to a through-hole wiring formed in the first package wafer.

13. The wafer level package structure as set forth in claim 12, wherein said first surface-activated region, said second surface-activated region, the surface-activated region of the first package wafer, and the surface-activated region of the second package wafer are any one of a plasma-treated surface, an ion-beam irradiated surface, and an atomic-beam irradiated surface.

14. The wafer level package structure as set forth in claim 12, wherein at least one of the bonding between said first surface-activated region and the surface-activated region on the first package wafer and the bonding between said second surface-activated region and the surface-activated region on the second package wafer is any one of the solid-phase direct bonding between Si and Si, the solid-phase direct bonding between Si and $SiO_2$, and the solid-phase direct bonding between $SiO_2$ and $SiO_2$.

15. The wafer level package structure as set forth in claim 12, wherein at least one of the bonding between said first surface-activated region and the surface-activated region on the first package wafer and the bonding between said second surface-activated region and the surface-activated region on the second package wafer is any one of the solid-phase direct bonding between Au and Au, the solid-phase direct bonding between Cu and Cu, and the solid-phase direct bonding between Al and Al.

16. The wafer level package structure as set forth in claim 12, wherein at least one of said first surface-activated region and said second surface-activated region comprises a ring-like outer surface-activated region formed over the entire circumference of said frame so as to surround said movable portion, and a ring-like inner surface-activated region formed at an inner side of said outer surface-activated region over the entire circumference of said frame so as to surround said movable portion.

17. The wafer level package structure as set forth in claim 12, wherein said integrated circuit is disposed so as to surround said opening of said frame.

18. The wafer level package structure as set forth in claim 12, wherein said through-hole wiring is formed in a tapered shape in the first package wafer such that an end portion facing said sensor unit has a larger area than the other end portion.

19. The wafer level package structure as set forth in claim 12, wherein each of said sensor units is an acceleration sensor unit,
said movable portion comprises a weight and a beam portion extending between said frame and said weight, and
said detecting portion comprises at least one piezoresistive element provided on said beam portion.

20. The wafer level package structure as set forth in claim 12, wherein each of said sensor units is a gyro sensor unit,
said movable portion comprises a first mass body vibrated by a vibrating means, and a second mass body coupled to the first mass body, and
said detecting portion is configured to convert a positional displacement of the second mass body caused when a rotational force is added during the vibration of the first mass body into an electrical signal.

21. The wafer level package structure as set forth in claim 12, wherein each of said sensor units has a conductive layer formed at a position closer to said movable portion than said first surface-activated region, and electrically connected to said detecting portion,
the first package wafer has a through-hole wiring, and a wiring layer electrically connected to said through-hole wiring with respect to each of said sensor units, and
the bonding between the first package wafer and said semiconductor wafer further comprises a solid-phase direct bonding without diffusion between an activated surface of said conductive layer and an activated surface of said wiring layer.

22. A sensor device obtained by cutting the wafer level package structure as set forth in claim 12 into a size of said sensor unit.

* * * * *